US006872950B2

(12) United States Patent
Shimada et al.

(10) Patent No.: US 6,872,950 B2
(45) Date of Patent: Mar. 29, 2005

(54) ELECTRON OPTICAL SYSTEM ARRAY, METHOD OF FABRICATING THE SAME, CHARGED-PARTICLE BEAM EXPOSURE APPARATUS, AND DEVICE MANUFACTURING METHOD

(75) Inventors: Yasuhiro Shimada, Kanagawa (JP); Takayuki Yagi, Kanagawa (JP); Haruhito Ono, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 327 days.

(21) Appl. No.: 09/819,669

(22) Filed: Mar. 29, 2001

(65) Prior Publication Data

US 2001/0054690 A1 Dec. 27, 2001

(30) Foreign Application Priority Data

Mar. 31, 2000 (JP) ........................................ 2000-097067
Mar. 15, 2001 (JP) ........................................ 2001-074736

(51) Int. Cl.$^7$ ............................................. H01J 37/304
(52) U.S. Cl. .................................. 250/396 R; 250/492.2
(58) Field of Search ............................ 250/396 R, 492.2, 250/398, 492.22, 492.23

(56) References Cited

U.S. PATENT DOCUMENTS

| 4,200,794 A | * | 4/1980 | Newberry et al. ....... 250/396 R |
| 4,354,111 A | | 10/1982 | Williams et al. ........ 250/396 R |
| 4,419,182 A | | 12/1983 | Westerberg et al. ......... 156/644 |
| 4,419,580 A | | 12/1983 | Walker et al. ........... 250/396 R |
| 4,569,033 A | | 2/1986 | Collins et al. ............... 364/845 |
| 4,607,167 A | | 8/1986 | Petric ....................... 250/492.2 |
| 4,742,234 A | | 5/1988 | Feldman et al. .......... 250/492.2 |
| 5,105,089 A | | 4/1992 | Yamada .................... 250/492.2 |
| 5,121,234 A | | 6/1992 | Kucera ......................... 359/50 |
| 5,215,623 A | | 6/1993 | Takahashi et al. ........... 156/644 |
| 5,260,579 A | | 11/1993 | Yasuda et al. ............ 250/492.2 |
| 5,324,930 A | | 6/1994 | Jech, Jr. ....................... 250/216 |
| 5,534,311 A | | 7/1996 | Shaw et al. .................. 427/526 |

(Continued)

FOREIGN PATENT DOCUMENTS

| JP | 56-19402 | 5/1981 |
| JP | 6-44093 | 2/1994 |
| JP | 2001-126651 | 5/2001 |

OTHER PUBLICATIONS

"Sub–Nanometer Miniature Electron Microscope", A.D. Feinerman, et al., Journal of Vacuum Science and Technology A, vol. 10, No. 4, Jul./Aug. 1992, 611–616.
"High Aspect Ratio Aligned Multilayer Microstructure Fabrication", K. Y. Lee, et al., Journal of Vacuum Science and Technology B, vol. 12, No. 6, Nov./Dec. 1994, pp. 3425–3430.
"Arrayed Miniature Electron Beam Columns For High Throughput Sub–100 nm Lithography", T. H. P. CHang, et al., Journal of Vacuum Science and Technology B, vol. 10, No. 6, Nov./Dec. 1992, pp. 2743–2748.
"Microstructures for Particle Beam Control", G. W. Jones, et al., Journal of Vacuum Science and Technology B, vol. 6, No. 6, Nov./Dec. 1988, pp. 2023–2027.
"A Multibeam Scheme for Electron–Beam Lithography", T. Sasaki, Journal of Vacuum Science and Technology, vol. 19, No. 4, Nov./Dec. 1981, pp. 963–965.

*Primary Examiner*—Kiet T. Nguyen
(74) *Attorney, Agent, or Firm*—Fitzpatrick, Cella, Harper & Scinto

(57) ABSTRACT

This invention relates to an electron optical system array having a plurality of electron lenses. The electron optical system array includes a plurality of electrodes arranged along the paths of a plurality of charged-particle beams. Each of the plurality of electrodes has a membrane in which a plurality of apertures are formed on the paths of the plurality of charged-particle beams, and a support portion which supports the membrane. At least two of the plurality of electrodes are arranged to form a nested structure.

23 Claims, 21 Drawing Sheets

U.S. PATENT DOCUMENTS

| | | | |
|---|---|---|---|
| 5,604,394 A | 2/1997 | Saito et al. .................. | 313/422 |
| 5,617,131 A | 4/1997 | Murano et al. .............. | 347/233 |
| 5,731,591 A | 3/1998 | Yamada et al. ........... | 250/492.2 |
| 5,834,783 A | 11/1998 | Muraki et al. .............. | 250/398 |
| 5,864,142 A | 1/1999 | Muraki et al. ........... | 250/491.1 |
| 5,905,267 A | 5/1999 | Muraki .................. | 250/492.22 |
| 5,929,454 A | 7/1999 | Muraki et al. ........... | 250/491.1 |
| 5,939,725 A | 8/1999 | Muraki .................. | 250/492.22 |
| 5,942,761 A | 8/1999 | Tuli ........................... | 250/556 |
| 5,973,332 A | 10/1999 | Muraki et al. ........... | 250/492.2 |
| 5,981,954 A | 11/1999 | Muraki ....................... | 250/397 |
| 6,014,200 A | 1/2000 | Sogard et al. ................ | 355/53 |
| 6,072,251 A | 6/2000 | Markle ....................... | 310/12 |
| 6,104,035 A | 8/2000 | Muraki .................. | 250/492.22 |
| 6,107,636 A | 8/2000 | Muraki .................... | 250/492.2 |
| 6,121,625 A | 9/2000 | Ito et al. ................ | 250/492.22 |
| 6,137,103 A | 10/2000 | Giles et al. ................. | 250/216 |
| 6,137,113 A | 10/2000 | Muraki .................. | 250/492.22 |
| 6,166,387 A | 12/2000 | Muraki et al. ........... | 250/492.2 |
| 6,184,850 B1 | 2/2001 | Suzuki et al. ................ | 345/74 |
| 6,188,074 B1 | 2/2001 | Satoh et al. ........... | 250/492.22 |
| 6,274,877 B1 | 8/2001 | Muraki .................. | 250/492.23 |
| 6,323,499 B1 | 11/2001 | Muraki et al. ......... | 250/492.22 |
| 6,337,485 B1 | 1/2002 | Muraki et al. ............ | 250/492.2 |
| 6,381,072 B1 | 4/2002 | Burger ....................... | 359/622 |
| 6,381,702 B1 | 4/2002 | Ogasawara ................. | 713/500 |
| 6,465,796 B1 | 10/2002 | Haraguchi et al. ..... | 250/492.23 |
| 6,469,799 B1 | 10/2002 | Kajita ....................... | 358/1.16 |
| 6,472,672 B1 | 10/2002 | Muraki .................... | 250/492.2 |
| 6,483,120 B1 | 11/2002 | Yui et al. .................. | 250/491.1 |
| 6,515,409 B2 | 2/2003 | Muraki et al. ........... | 313/359.1 |
| 6,566,644 B1 | 5/2003 | Muraki .................. | 250/492.22 |
| 6,566,664 B2 | 5/2003 | Muraki .................... | 250/492.2 |
| 6,603,128 B2 | 8/2003 | Maehara et al. ........ | 250/441.11 |
| 6,617,595 B1 | 9/2003 | Okunuki ................ | 250/492.22 |
| 2001/0052576 A1 | 12/2001 | Shimada et al. ......... | 250/492.1 |
| 2002/0000766 A1 | 1/2002 | Ono et al. .................. | 313/240 |
| 2002/0005491 A1 | 1/2002 | Yagi et al. .................. | 250/396 |
| 2002/0008207 A1 | 1/2002 | Muraki et al. .............. | 250/398 |
| 2002/0009901 A1 | 1/2002 | Maehara et al. ............ | 438/795 |
| 2002/0051111 A1 | 5/2002 | Greene et al. .............. | 349/149 |
| 2002/0160311 A1 | 10/2002 | Muraki et al. .............. | 430/926 |
| 2002/0179855 A1 | 12/2002 | Muraki .................. | 250/492.22 |
| 2003/0094584 A1 | 5/2003 | Yui et al. ................ | 250/492.22 |
| 2003/0209673 A1 | 11/2003 | Ono et al. .............. | 250/396 R |
| 2004/0061064 A1 | 4/2004 | Ono et al. ............... | 250/396 R |

\* cited by examiner

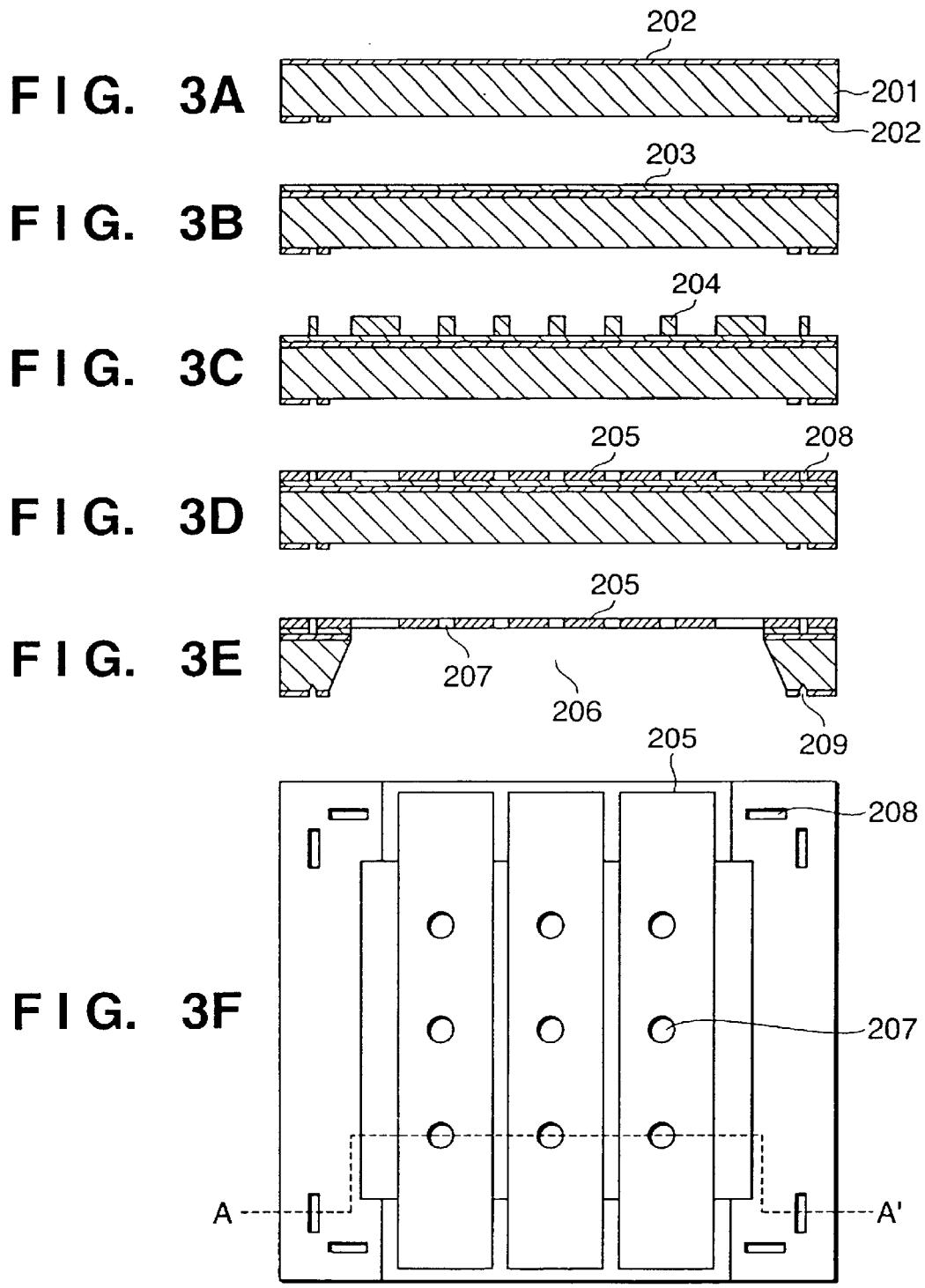

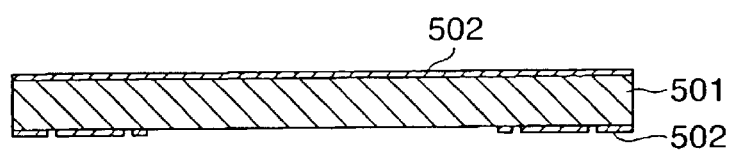
FIG. 7A
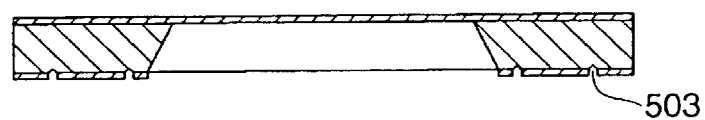
FIG. 7B
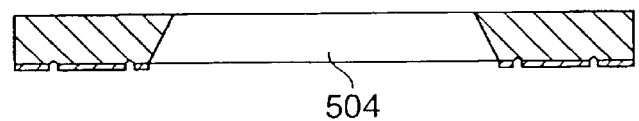
FIG. 7C
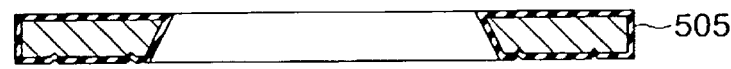
FIG. 7D
FIG. 7E
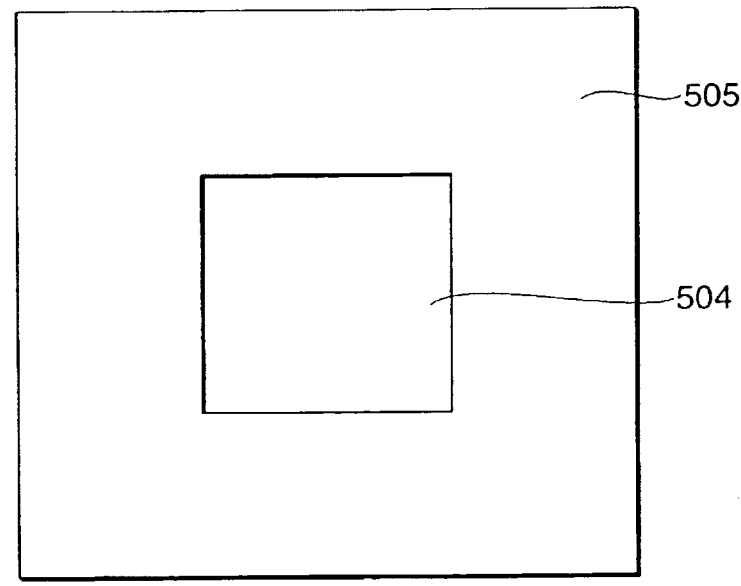

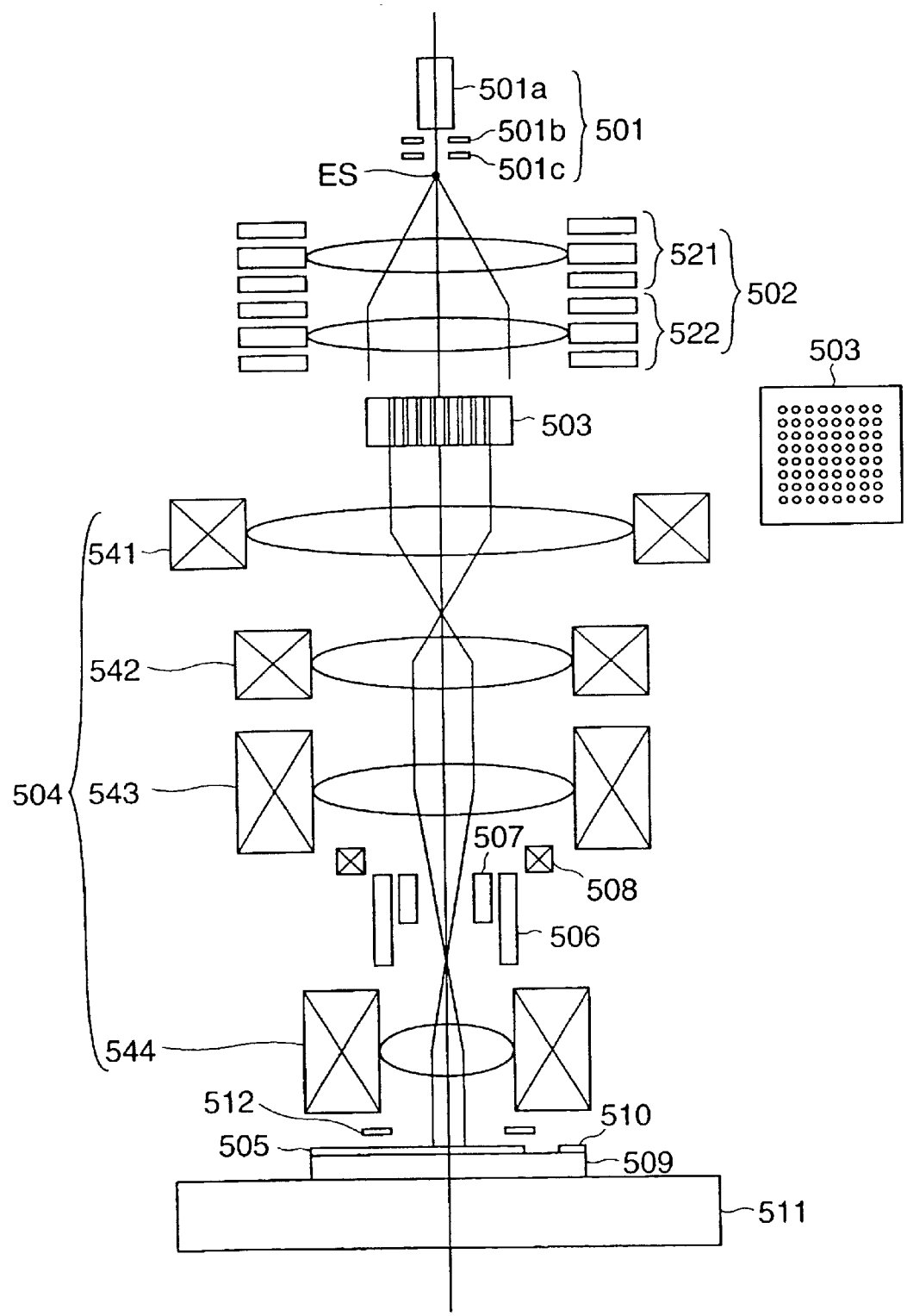
F I G. 15

FIG. 19

```
URL  http://www.maintain.co.jp/db/input.html

TROUBLE DB INPUT WINDOW

OCCURRENCE DATE.  [2000/3/15] ~4040
TYPE OF APPARATUS. [**********] ~4010
SUBJECT           [OPERATION ERROR (START-UP ERROR)] ~4030
SERIAL NUMBER S/N [465NS4580001] ~4020
DEGREE OF URGENCY [D] ~4050
SYMPTOM  [LED IS KEPT FLICKERING AFTER
          POWER-ON]                          ~4060

REMEDY   [POWER ON AGAIN
          (PRESS RED BUTTON IN ACTIVATION)]  ~4070

PROGRESS [INTERIM HAS BEEN DONE]             ~4080

(SEND) (RESET)     4100              4110              4120
LINK TO RESULT LIST DATABASE   SOFTWARE LIBRARY   OPERATING GUIDE
```

ELECTRON OPTICAL SYSTEM ARRAY, METHOD OF FABRICATING THE SAME, CHARGED-PARTICLE BEAM EXPOSURE APPARATUS, AND DEVICE MANUFACTURING METHOD

FIELD OF THE INVENTION

The present invention relates to an electron optical system array suitable for an exposure apparatus using charged-particle beams such as electron beams and, more particularly, to an electron optical system array having a plurality of electron lenses.

BACKGROUND OF THE INVENTION

In production of semiconductor devices, an electron beam exposure technique receives a great deal of attention as a promising candidate of lithography capable of micro-pattern exposure at a line width of 0.1 $\mu$m or less. There are several electron beam exposure methods. An example is a variable rectangular beam method of drawing a pattern with one stroke. This method suffers many problems as a mass-production exposure apparatus because of a low throughput. To attain a high throughput, there is proposed a pattern projection method of reducing and transferring a pattern formed on a stencil mask. This method is advantageous to a simple repetitive pattern but disadvantageous to a random pattern such as a logic interconnection pattern in terms of the throughput, and a low productivity disables practical application.

To the contrary, a multi-beam system for drawing a pattern simultaneously with a plurality of electron beams without using any mask has been proposed and is very advantageous for practical use because of the absence of physical mask formation and exchange. What is important in using multi-electron beams is the number of electron lenses formed in an array used in an electron optical system. The number of electron lenses determines the number of electron beams, and is a main factor which determines the throughput. Downsizing while improving the performance of the electron optical system array is one of the keys to improving the performance of the multi-beam exposure apparatus.

Electron lenses are classified into electromagnetic and electrostatic types. The electrostatic electron lens does not require any coil core or the like, is simpler in structure than the electromagnetic electron lens, and is more advantageous to downsizing. Principal prior arts concerning downsizing of the electrostatic electron lens (electrostatic lens) will be described.

U.S. Pat. No. 4,419,580 proposes an electron optical system array in which electron lenses are two-dimensionally arrayed on an Si substrate and electrodes are aligned by V-grooves and cylindrical spacers. K. Y. Lee et al. (J. Vac. Sci. Technol. B12(6), November/December 1994, pp. 3,425–3,430) disclose a multilayered structure of Si and Pyrex glass fabricated by using anodic bonding, and provides microcolumn electron lenses aligned at a high precision.

In the electron optical system array disclosed in U.S. Pat. No. 4,419,580, Si substrates that are processed thin must be stacked. The fabrication process becomes difficult at a small electrode interval, and the multilayered structure is low in strength.

The electron optical system array disclosed by K. Y. Lee et al. suffers various problems which should be solved, such that 1) glass may not be sandwiched at a small electrode interval, and 2) anodic bonding must be repeated many times and the process is complicated (bonding must be repeated 2(n−1) times).

SUMMARY OF THE INVENTION

The present invention has been made to overcome the conventional drawbacks, and has as its principal object to provide an improvement of the prior arts. It is an object of the present invention to provide an electron optical system array which realizes various conditions such as downsizing, high precision, and high reliability at high level. It is another object of the present invention to provide a high-precision exposure apparatus using the electron optical system array, a high-productivity device manufacturing method, a semiconductor device production factory, and the like.

According to the first aspect of the present invention, there is provided an electron optical system array having a plurality of electron lenses, comprising a plurality of electrodes arranged along paths of a plurality of charged-particle beams, wherein each of the plurality of electrodes has a membrane in which a plurality of apertures are formed on the paths of the plurality of charged-particle beams, and a support portion which supports the membrane, and at least two of the plurality of electrodes are arranged to form a nested structure.

According to a preferred mode of the present invention, it is preferable that the electron optical system array further comprise a base member, and that the support portions of at least two electrodes which form the nested structure be supported by the base member. In this case, the support portions of at least two electrodes which form the nested structure are supported by one surface of the base member.

According to another preferred mode of the present invention, e.g., all the plurality of electrodes are arranged to form a nested structure. In this case, the electron optical system array further comprises a base member, and, e.g., the support portions of all the plurality of electrodes are supported by the base member. The support portions of all the plurality of electrodes may be supported by one surface of the base member.

According to still another preferred mode of the present invention, the plurality of electrodes may be arranged to form at least two nested structures. In this case, the electron optical system array may further comprise a base member having first and second surfaces, and the base member may support one of at least two nested structures by the first surface and support the other one of at least two nested structures by the second surface. Alternatively, the electron optical system array may further comprise at least two base members which respectively support at least two nested structures. Alternatively, the electron optical system array may further comprise a coupling portion which couples at least two nested structures.

According to still another preferred mode of the present invention, the support portions of at least two electrodes which form the nested structure have hollow portions, and one electrode is arranged inside the hollow portion of the other electrode.

According to still another preferred mode of the present invention, one of the plurality of electrodes except for at least two electrodes which form the nested structure may face an electrode located farthest from the base member out of at least two electrodes which form the nested structure. In this case, the support portion of one of the plurality of electrodes except for at least two electrodes which form the nested structure is preferably smaller in size than the support portion of the electrode located farthest from the base member out of at least two electrodes which form the nested structure.

According to still another preferred mode of the present invention, the plurality of electrodes are arranged to prevent the membranes of the plurality of electrodes from contacting each other.

According to still another preferred mode of the present invention, at least one of the plurality of electrodes is preferably divided in units of columns each formed from a plurality of apertures.

According to still another preferred mode of the present invention, the number of electrodes which form the nested structure is typically two or three, but may be four or more.

According to still another preferred mode of the present invention, at least one of the plurality of electrodes is an electrode for forming an electric field which acts on a charged-particle beam, and at least another one of the plurality of electrodes is a shield electrode.

According to the second aspect of the present invention, there is provided a method of manufacturing an electron optical system array having a plurality of electron lenses, comprising the preparation step of preparing a plurality of electrodes each having a membrane in which a plurality of apertures are formed, and a support portion which supports the membrane, the step of preparing a base member, and the fixing step of fixing the support portions of the plurality of electrodes to the base member so as to form a nested structure by all or some of the plurality of electrodes. In the electrode preparation step, the plurality of electrodes are fabricated using, e.g., plating.

According to the third aspect of the present invention, there is provided a charged-particle beam exposure apparatus comprising a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrodes arranged along paths of a plurality of charged-particle beams concerning the plurality of intermediate images, each of the plurality of electrodes has a membrane in which a plurality of apertures are formed on the paths of the plurality of charged-particle beams, and a support portion which supports the membrane, and at least two of the plurality of electrodes are arranged to form a nested structure.

According to the fourth aspect of the present invention, there is provided a device manufacturing method comprising the steps of installing a plurality of semiconductor manufacturing apparatuses including a charged-particle beam exposure apparatus in a factory, and manufacturing a semiconductor device by using the plurality of semiconductor manufacturing apparatuses. The charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrodes arranged along paths of a plurality of charged-particle beams concerning the plurality of intermediate images, each of the plurality of electrodes has a membrane in which a plurality of apertures are formed on the paths of the plurality of charged-particle beams, and a support portion which supports the membrane, and at least two of the plurality of electrodes are arranged to form a nested structure.

According to a preferred mode of the present invention, the manufacturing method preferably further comprises the steps of connecting the plurality of semiconductor manufacturing apparatuses by a local area network, connecting the local area network to an external network of the factory, acquiring information about the charged-particle beam exposure apparatus from a database on the external network by using the local area network and the external network, and controlling the charged-particle beam exposure apparatus on the basis of the acquired information.

According to the fifth aspect of the present invention, there is provided a semiconductor manufacturing factory comprising a plurality of semiconductor manufacturing apparatuses including a charged-particle beam exposure apparatus, a local area network for connecting the plurality of semiconductor manufacturing apparatuses, and a gateway for connecting the local area network to an external network of the semiconductor manufacturing factory. The charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrodes arranged along paths of a plurality of charged-particle beams concerning the plurality of intermediate images, each of the plurality of electrodes has a membrane in which a plurality of apertures are formed on the paths of the plurality of charged-particle beams, and a support portion which supports the membrane, and at least two of the plurality of electrodes are arranged to form a nested structure.

According to the sixth aspect of the present invention, there is provided a maintenance method for a charged-particle beam exposure apparatus, comprising the steps of preparing a database for storing information about maintenance of the charged-particle beam exposure apparatus on an external network of a factory where the charged-particle beam exposure apparatus is installed, connecting the charged-particle beam exposure apparatus to a local area network in the factory, and maintaining the charged-particle beam exposure apparatus on the basis of the information stored in the database by using the external network and the local area network. The charged-particle beam exposure apparatus includes a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array. The electron optical system array includes a plurality of electrodes arranged along paths of a plurality of charged-particle beams concerning the plurality of intermediate images, each of the plurality of electrodes has a membrane in which a plurality of apertures are formed on the paths of the plurality of charged-particle beams, and a support portion which supports the membrane, and at least two of the plurality of electrodes are arranged to form a nested structure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A to 3F are views for explaining a method of forming a middle electrode in FIG. 1;

FIGS. 7A to 7E are views for explaining a method of forming a base substrate in FIG. 5;

FIG. 15 is a view showing an entire multi-beam exposure apparatus;

FIG. 19 is a view showing a user interface on a display;

DETAILED DESCRIPTION OF THE PREFERRED EMBODIMENTS

Preferred embodiments of the present invention will be described below.

First Embodiment

Figure 1:
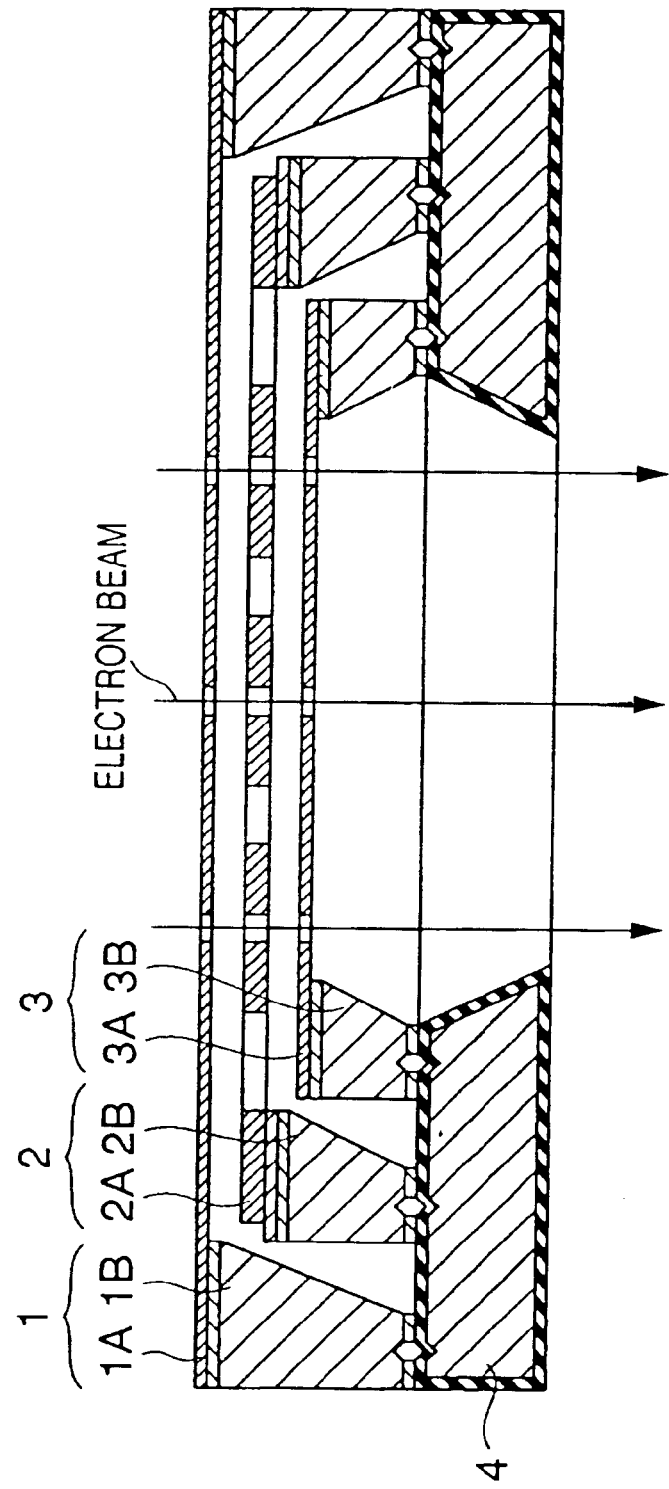
FIG. 1 is a sectional view for explaining the structure of an electron optical system array according to a preferred embodiment of the present invention.

An electron optical system array according to the first embodiment of the present invention will be described with reference to FIG. 1. In this electron optical system array, upper, middle, and lower electrodes 1, 2, and 3 have a nested structure and are supported by the same surface of a base substrate 4. That is, the electron optical system array comprises the first, second, and third electrodes 1, 2, and 3 respectively having membranes 1A, 2A, and 3A in which a plurality of apertures are formed on the paths of a plurality of electron beams (charged-particle beams), and support substrates 1B, 2B, and 3B which support corresponding membranes. These membranes are spatially insulated. The support substrates of the first to third electrodes are held by the single base substrate 4. The three electrodes form a nested structure such that the support substrate 2B of the second electrode 2 is located inside the support substrate 1B of the first electrode 1 and the support substrate 3B of the third electrode 3 is located inside the support substrate 2B of the second electrode 2. For descriptive convenience, the first embodiment exemplifies only 3×3 apertures for each electrode, but in practice the electrode can have a larger number of apertures (e.g., 8×8 apertures).

A method of fabricating the electron optical system array will be explained. FIGS. 2A to 2D show a method of forming the upper and lower electrodes 1 and 3. For descriptive convenience, the method of forming the upper and lower electrodes 1 and 3 will be described with reference to FIGS. 2A to 2D. These electrodes have different shapes and sizes, as shown in FIG. 1.

Figure 2A:
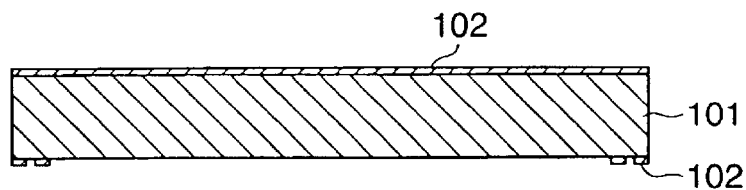
FIGS. 2A to 2D are views for explaining a method of forming upper and lower electrodes in FIG. 1.

A silicon wafer of the <100> direction is prepared as a substrate 101, and 300-nm thick $SiO_2$ films are formed as mask layers 102 on the two surfaces of the substrate 101 by thermal oxidation. Portions of one mask layer 102 that serve as a prospective hollow portion and alignment grooves are removed by patterning the mask layer 102 by resist and etching processes (FIG. 2A). The size and thickness of the substrate 101 can be appropriately selected in accordance with the sizes of the first and third electrodes 1 and 3.

Figure 2B:
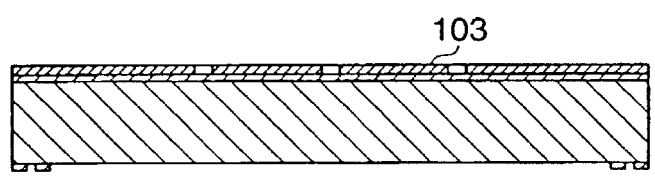

Titanium and copper are successively deposited to film thicknesses of 5 nm and 5 $\mu$m on the upper surface of the substrate, and patterned by resist and etching processes to form an electrode layer 103 having a plurality of apertures 105 at prospective paths of electron beams (charged-particle beams). The deposition method is, e.g., deposition using resistance heating or an electron beam, or sputtering. As another electrode material, titanium/gold or titanium/platinum may be used (FIG. 2B).

Figure 2C:
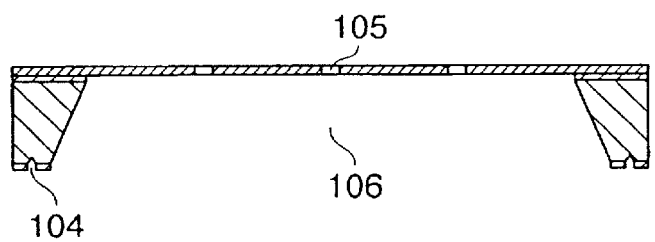
Figure 2D:
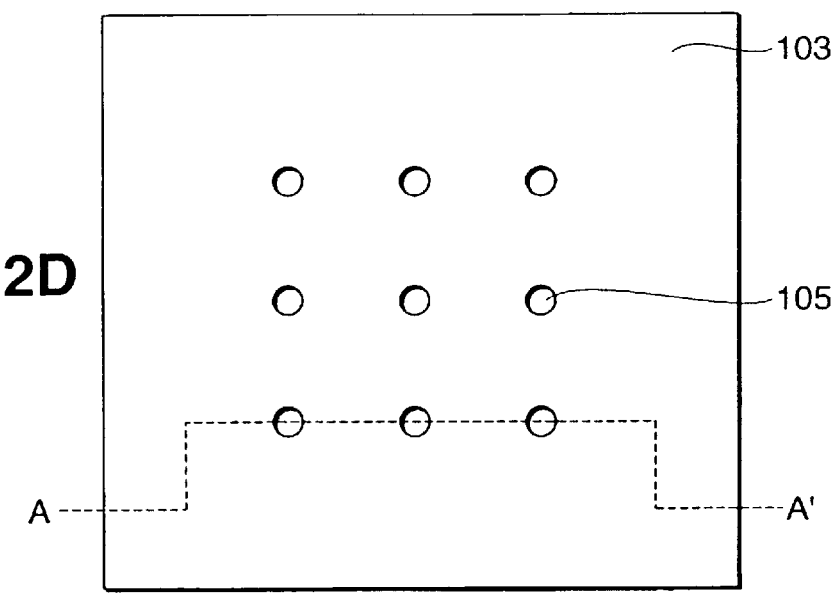

The electrode layer 103 is protected with polyimide. The silicon substrate 101 is etched back from the other surface at 90° C. by using a 22% aqueous tetramethylammonium hydroxide solution. Etching is continued until silicon is etched away and the other mask layer 102 is exposed, thereby forming a hollow portion 106 and alignment grooves 104. The substrate is cleaned with water and dried. The mask layer 102 exposed after dry etching of silicon is etched away by using tetrafluoromethane in a dry etching apparatus. The polyimide film used to protect the other surface is removed by ashing. As a result, the upper and lower electrodes 1 and 3 each having a plurality of apertures 105 on prospective electron beam paths are obtained (FIG. 2C). FIG. 2D is a plan view of the completed electrode shown in FIG. 2C.

A method of forming the middle electrode 2 will be described with reference to FIGS. 3A to 3F. A silicon wafer of the <100> direction is prepared as a substrate 201, and 300-nm thick $SiO_2$ films are formed as mask layers 202 on the two surfaces of the substrate 201 by thermal oxidation. Portions of one mask layer 202 that serve as a prospective hollow portion and alignment grooves are removed by patterning the mask layer 202 by resist and etching processes (FIG. 3A).

Chromium and gold are deposited as a plating electrode 203 to film thicknesses of 5 nm and 100 nm (FIG. 3B). A resist pattern 204 serving as a plating mold is formed on the plating electrode 203. The resist is formed to a film thickness of 60 $\mu$m by using SU-8 (Micro Chem. Co) mainly consisting of an epoxidized bisphenol A oligomer. Exposure is performed for, e.g., 60 sec by a contact type exposure apparatus using a high-pressure mercury lamp. After exposure, post-exposure bake (PEB) is done on a hot plate at 85° C. for 30 min. After the substrate is gradually cooled to room temperature, the resist is developed with propylene glycol monomethyl ether acetate for 5 min to complete the plating mold pattern 204. As another resist, a polyvinylphenol-based or cyclized rubber-based negative resist or a novolac-based positive resist can be used. For a resist material which is difficult to form a thick film, the resist may be applied a plurality of number of times (FIG. 3C).

The gaps of the resist 204 are filled with an electrode layer by electroplating, thus forming an electrode layer 205 having alignment grooves 208 in addition to a plurality of apertures at prospective electron beam paths. More specifically, the gaps of the resist pattern 204 can be filled with a 50-$\mu$m thick copper pattern by electroplating using, e.g., an acid copper plating solution at a plating solution flow rate of 5 L/min, a current density of 7.5 mA/cm$^2$, and a solution temperature of 28° C. for 6 h and 40 min. The SU-8 resist 204 is removed in N-methylpyrrolidone (NMP) at 80° C., and the substrate is cleaned and dried by IPA to obtain a copper pattern as the electrode layer 205. The metal which forms the electrode layer can be a nonmagnetic material such as gold or platinum, other than copper (FIG. 3D).

The plating surface is protected with polyimide (not shown). The silicon substrate 201 is etched back from the other surface at 90° C. by using a 22% aqueous tetramethylammonium hydroxide solution until the other mask layer 202 is exposed. Etching is continued until silicon is etched away and the mask layer 202 is exposed, thereby forming a hollow portion 206 and alignment grooves 209. The substrate is cleaned with water and dried. The mask layer 202 and plating electrode 203 exposed after dry etching of silicon are etched away by using tetrafluoromethane in a dry etching apparatus. The polyimide film which protects the other surface is removed by ashing to complete the middle electrode 2 (FIG. 3E). FIG. 3F is a plan view of the completed middle electrode 2 shown in FIG. 3E. The first embodiment forms the divided electrodes 205 for grouping arrayed apertures in units of columns. The electrode fabricated by plating is higher in conductivity and higher in electrode performance than a doped-silicon electrode.

Figure 4A:
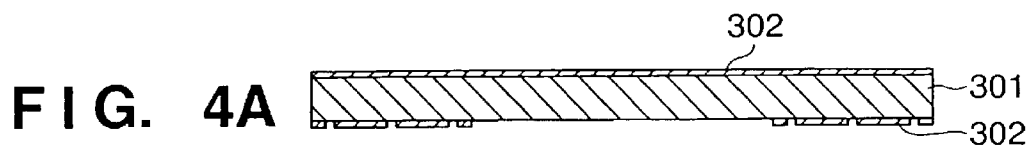
FIGS. 4A to 4E are views for explaining a method of forming a base substrate in FIG. 1.

A method of forming the base substrate 4 is shown in FIGS. 4A to 4E. A silicon wafer of the <100> direction is prepared as a substrate 301, and 300-nm thick $SiO_2$ films are formed as mask layers 302 on the two surfaces of the substrate by thermal oxidation. Portions of one mask layer 302 that serve as a prospective through hole and alignment grooves are removed by patterning the mask layer 302 by resist and etching processes (FIG. 4A).

Figure 4B:
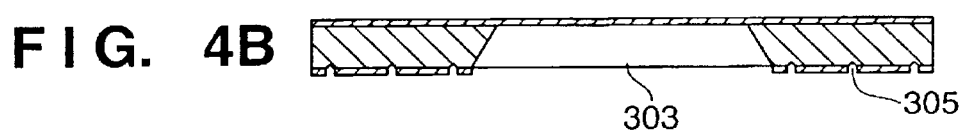

The silicon substrate 301 is etched back at 90° C. by using a 22% aqueous tetramethylammonium hydroxide solution until the other mask layer 302 is exposed. At this time, alignment grooves 305 are formed (FIG. 4B).

Figure 4C:
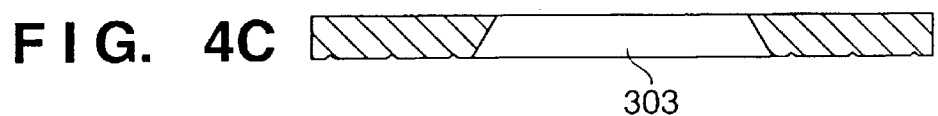
Figure 4D:
Figure 4E:
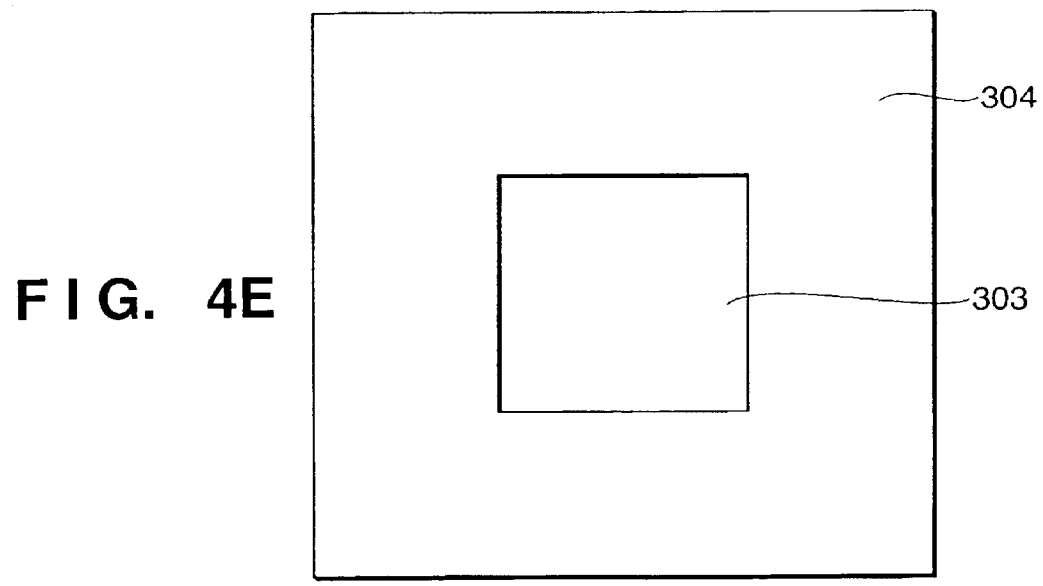

The remaining mask layer 302 is removed by using an aqueous solution mixture of hydrogen fluoride and ammonium fluoride, thereby forming a through hole 303 (FIG. 4C). A 300-nm thick $SiO_2$ layer 304 is formed as an insulating layer on the entire surface of the substrate by thermal oxidation (FIG. 4D). FIG. 4E is a plan view of the completed base substrate 4 shown in FIG. 4D.

The electrodes 1, 2, and 3 fabricated in this manner are aligned and joined to the base substrate 4 in the following procedures. The lower electrode 3 is first joined and fixed to the upper surface of the base substrate 4. Then, the middle electrode 2 is joined and fixed to the upper surface of the base substrate 4. Finally, the upper electrode 1 is joined and fixed to the upper surface of the base substrate 4. As the joining method, an aqueous hydrofluoric acid solution is applied to a joining portion, alignment grooves are observed with an infrared camera, and substrates are aligned such that all the alignment grooves overlap each other. After that, the two substrates are joined. As a simpler method, substrates may be joined with an adhesive. In this case, an adhesive almost free from degassing in vacuum is selected.

The electron optical system array having this structure exhibits the following excellent effects because of the nested structure of electrodes, and can realize various conditions such as downsizing, high precision, and high reliability at high level.

(1) The interval between the membranes of respective electrodes can be easily decreased. This effect is prominent particularly in a multilayered structure of three or more electrodes.

(2) Since the substrate portion (support portion) of each electrode can be made thick, a high strength can be ensured to increase the reliability, processability, and ease of assembly.

(3) Since each electrode is aligned using one base substrate as a position reference, the alignment accuracy of substrates increases.

Second Embodiment

Figure 5:
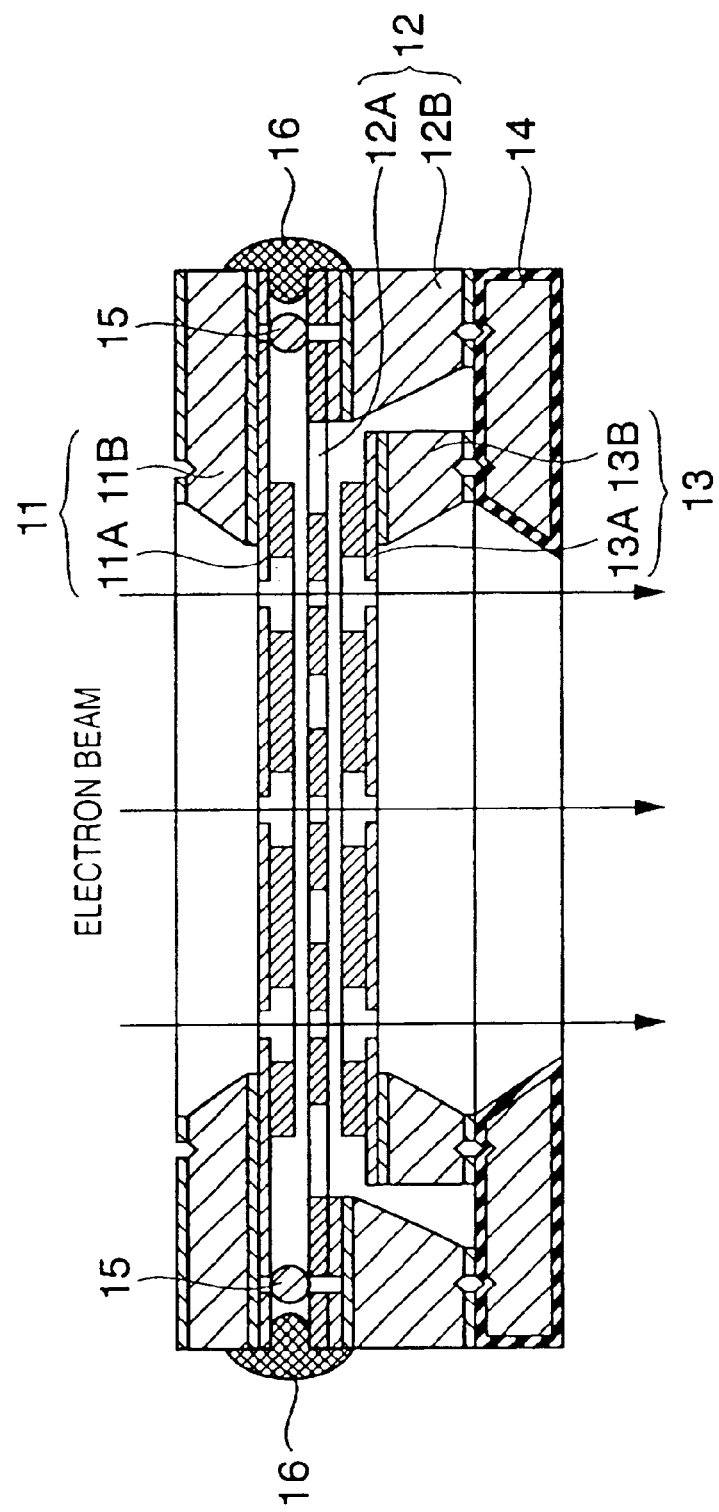
FIG. 5 is a sectional view for explaining the structure of an electron optical system array according to another embodiment.

FIG. 5 is a sectional view showing an electron optical system array according to the second embodiment of the present invention. In this electron optical system array, middle and lower electrodes 12 and 13 are fixed to a base substrate 14 to form a nested structure, whereas an upper electrode 11 is fixed to the middle electrode 12 without nesting. The upper and middle electrodes 11 and 12 are fixed with an adhesive 16 via spacers 15 such as fibers, and the outer size of the spacer 15 determines the substrate interval. In FIG. 5, reference numerals 11A, 12A, and 13A denote membranes of the upper, middle, and lower electrodes 11, 12, and 13, respectively; and 11B, 12B, and 13B, membrane support substrates of the upper, middle, and lower electrodes 11, 12, and 13.

FIGS. 6A to 6F show a method of forming the upper and lower electrodes 11 and 13. For descriptive convenience, the method of forming the upper and lower electrodes 11 and 13 will be explained with reference to FIGS. 6A to 6F. These electrodes have different shapes and sizes, as shown in FIG. 5.

Figure 6A:
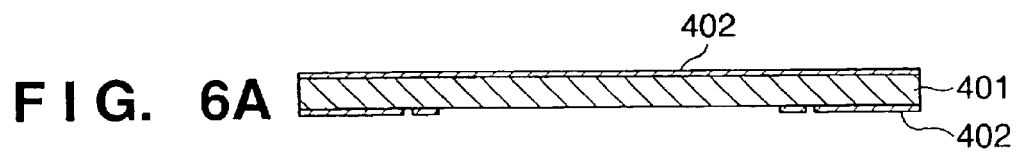
FIGS. 6A to 6G are views for explaining a method of forming upper and lower electrodes in FIG. 5.

A silicon wafer of the <100> direction is prepared as a substrate 401, and 300-nm thick $SiO_2$ layers are formed as mask layers 402 on the two surfaces of the substrate 401 by thermal oxidation. Portions of one mask layer that serve as a prospective hollow portion and alignment grooves are removed by patterning the mask layer by resist and etching processes (FIG. 6A).

Figure 6B:

Titanium and copper are successively deposited to film thicknesses of 5 nm and 5 μm, and patterned by resist and etching processes to form an electrode layer 404 having alignment grooves 403. The deposition method is, e.g., deposition using resistance heating or an electron beam, or sputtering. As another electrode material, titanium/gold or titanium/platinum may be used (FIG. 6B).

Figure 6C:
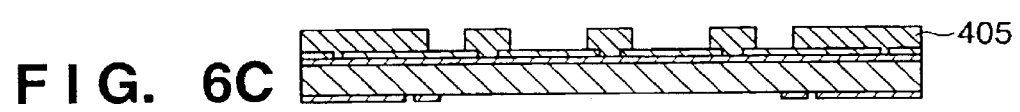

By the same method as in FIG. 3C described above, a resist pattern 405 serving as a plating mold is formed on the electrode layer 404. The resist adopts SU-8, and its film thickness is 110 μm (FIG. 6C).

Figure 6D:
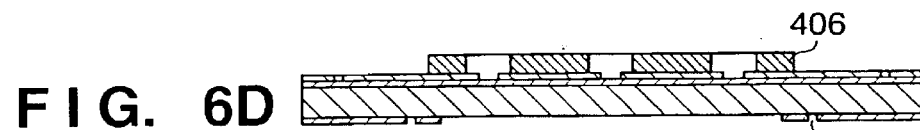

By the same method as in FIG. 3D, 100-μm thick shield electrodes 406 are formed in the openings of the resist 405 by electroplating copper. The SU-8 resist 405 is removed in N-methylpyrrolidone (NMP) at 80° C., and the substrate is cleaned and dried by IPA to obtain a copper pattern as the shield electrodes 406 (FIG. 6D).

Figure 6E:
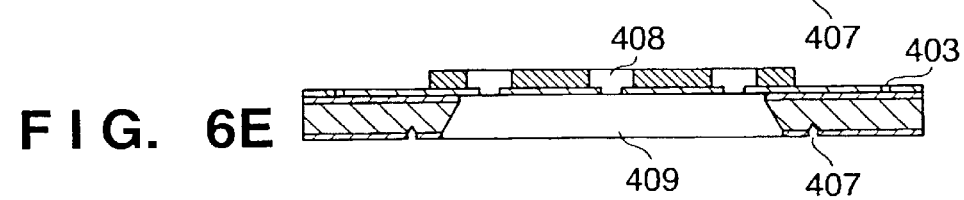
Figure 6F:
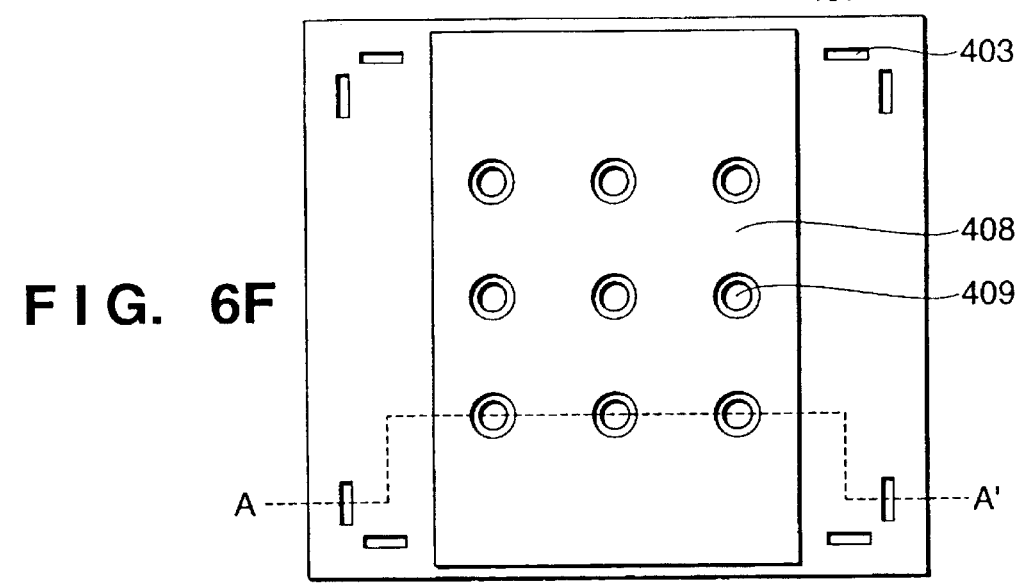

The plating surface is protected with polyimide (not shown). The silicon substrate 401 is etched back from the other surface at 90° C. by using a 22% aqueous tetramethylammonium hydroxide solution. Etching is continued until silicon is etched away and the other mask layer 402 is exposed, thereby forming a hollow portion 409 and alignment grooves 407. The substrate is cleaned with water and dried. The mask layer exposed after dry etching of silicon is etched away by using tetrafluoromethane in a dry etching apparatus. The polyimide film which protects the other surface is removed by ashing to complete the upper and lower electrodes 11 and 13 each having a plurality of apertures at prospective electron beam paths (FIG. 6E). FIG. 6F is a plan view of the completed electrode shown in FIG. 6F.

Figure 6G:

As for the lower electrode 13 located inside the nested structure, the two ends of the substrate are finally cut, as shown in FIG. 6G. Cutting can be done with a device such as a dicing saw or laser cutter used in a semiconductor manufacturing process.

FIGS. 7A to 7E are views showing a method of forming the base substrate 14. A silicon wafer of the <100> direction is prepared as a substrate 501, and 300-nm thick SiO$_2$ layers are formed as mask layers 502 on the two surfaces of the substrate by thermal oxidation. Portions of one mask layer 502 that serve as a prospective through hole and alignment grooves are removed by patterning the mask layer 502 by resist and etching processes (FIG. 7A).

The silicon substrate is etched back at 90° C. by using a 22% aqueous tetramethylammonium hydroxide solution until the other mask layer 502 is exposed. At this time, alignment grooves 503 are formed (FIG. 7B).

The remaining mask layer 502 is removed by using an aqueous solution mixture of hydrogen fluoride and ammonium fluoride, thereby forming a through hole 504 (FIG. 7C). A 300-nm thick SiO$_2$ film is formed as an insulating layer 505 on the entire surface of the substrate by thermal oxidation (FIG. 7D). FIG. 7E is a plan view of the electrode shown in FIG. 7D.

The electrodes 11, 12, and 13 fabricated in this way are aligned and joined to the base substrate 14 in the following procedures. The lower electrode 13 is first joined and fixed to the upper surface of the base substrate 14. Then, the middle electrode 12 is joined and fixed to the upper surface of the base substrate 14. In joining each electrode, an aqueous hydrofluoric acid solution is applied to a joining portion, and the electrode is aligned and joined while observed with an infrared camera. The upper electrode 11 is joined and fixed to the upper surface of the middle electrode 12. The upper and middle electrodes 11 and 12 are joined with the adhesive 16 after they are aligned to locate the spacers 15 in the alignment grooves of the two substrates. As the adhesive, one almost free from degassing in vacuum is selected.

Third Embodiment

Figure 8:
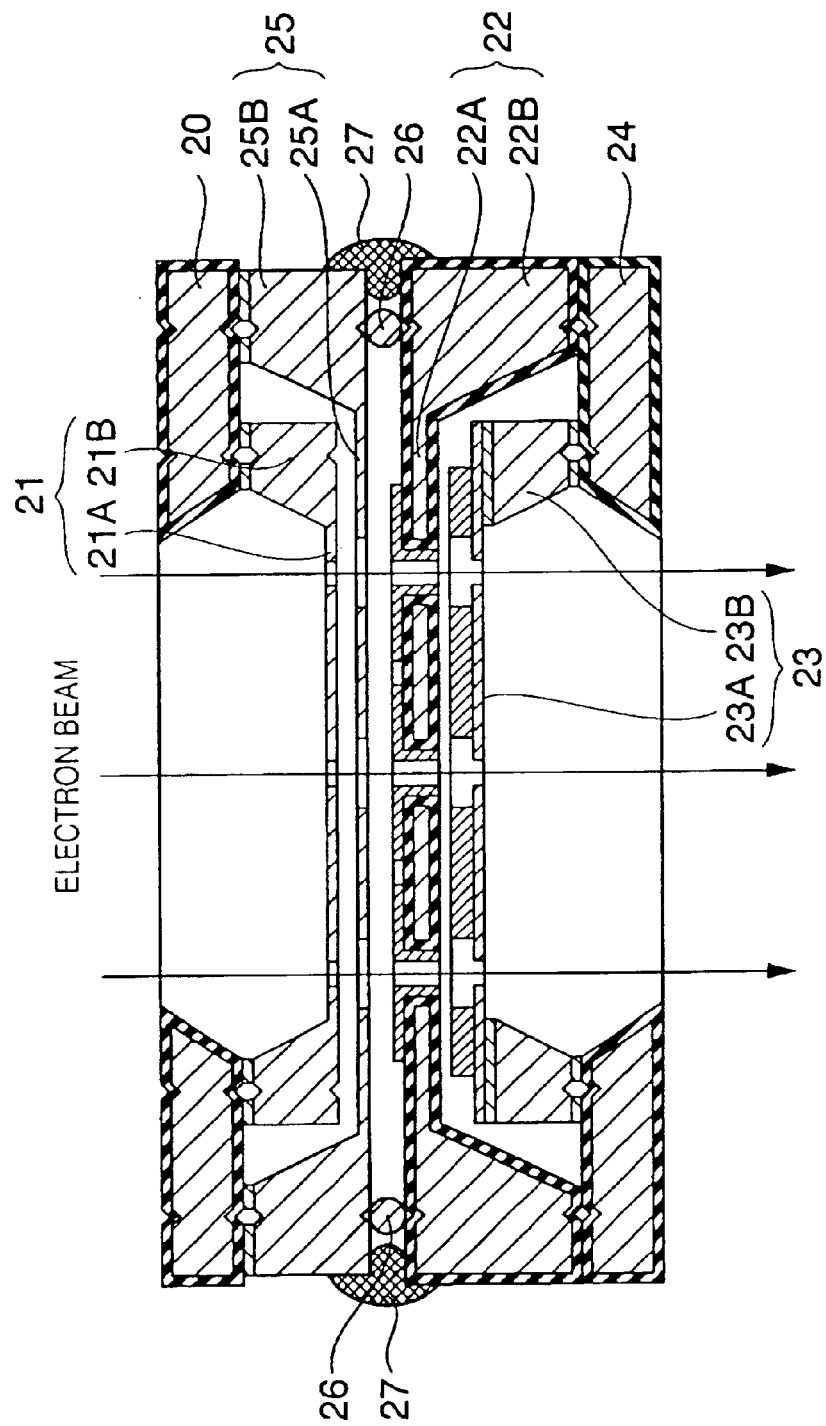
FIG. 8 is a sectional view for explaining the structure of an electron optical system array according to still another embodiment.

FIG. 8 is a sectional view showing an electron optical system array according to the third embodiment of the present invention. This electron optical system array employs a shield electrode 25 between upper and middle electrodes 21 and 22. More specifically, the electron optical system array has two units respectively made up of the upper electrode 21 and shield electrode 25 of a nested structure that are fixed to a base substrate 20, and a lower electrode 23 and the middle electrode 22 that are fixed to a base substrate 24. These units are fixed with an adhesive 27 via spacers 26. In FIG. 8, reference numerals 21A, 22A, 23A, and 25A denote membranes of the upper, middle, lower, and shield electrodes 21, 22, 23, and 25, respectively; and 21B, 22B, 23B, and 25B, membrane support substrates of the upper, middle, lower, and shield electrodes 21, 22, 23, and 25.

Figure 9A:
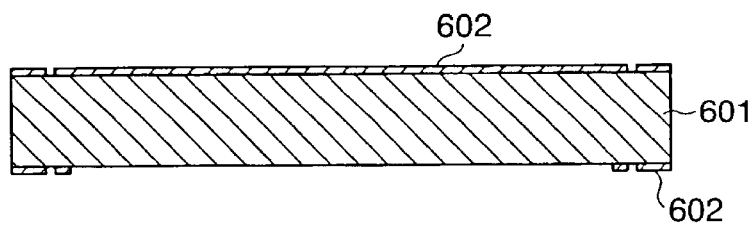
FIGS. 9A to 9F are views for explaining a method of forming a middle electrode in FIG. 8.

FIGS. 9A to 9F are views for explaining a method of forming the middle electrode 22. A silicon wafer 601 of the <100> direction is prepared, and 300-nm thick SiO$_2$ layers are formed as mask layers 602 on the two surfaces of the substrate 601 by thermal oxidation. Portions of one mask layer 602 that serve as a prospective hollow portion and alignment grooves are removed by patterning the mask layer 602 by resist and etching processes (FIG. 9A).

Figure 9B:
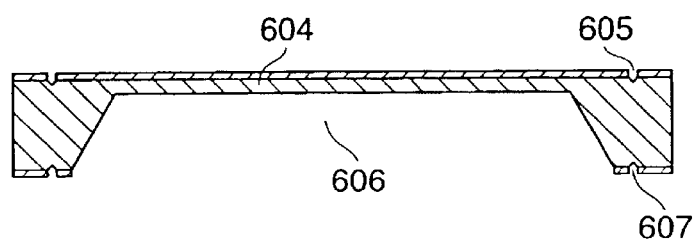

The silicon substrate is anisotropically etched by using an aqueous potassium hydroxide solution to form a 50-μm thick membrane portion 604, a hollow portion 606, and alignment grooves 605 and 607 (FIG. 9B).

Figure 9C:
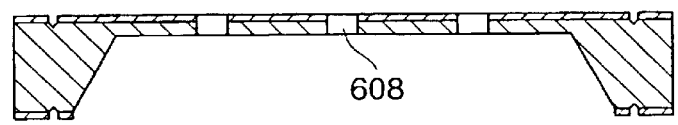

A resist is applied and patterned by photolithography. The mask layer 602 and silicon substrate 601 are etched by reactive ion etching using the patterned resist as a mask, thus forming a plurality of apertures 608 at prospective electron beam paths (FIG. 9C).

Figure 9D:
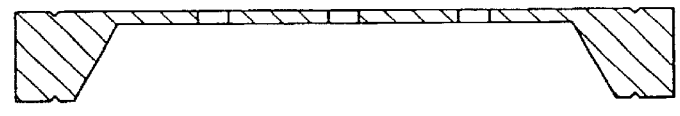

The mask layers 602 on the two surfaces are removed by using an aqueous solution mixture of hydrofluoric acid and ammonium fluoride (FIG. 9D).

Figure 9E:
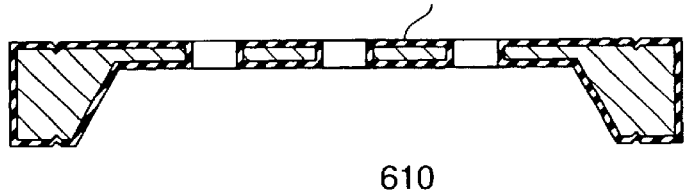

A 300-nm thick SiO$_2$ film is formed as an insulating layer 609 by thermal oxidation so as to cover the substrate (FIG. 9E).

Figure 9F:
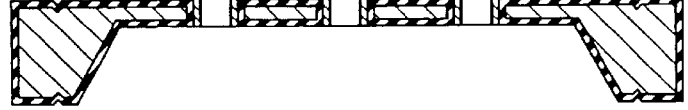

A 50-nm thick Ti film and 100-nm thick Au film are formed by vacuum evaporation, and patterned by photolithography to form divided wiring lines 610 (FIG. 9F).

Figure 10A:
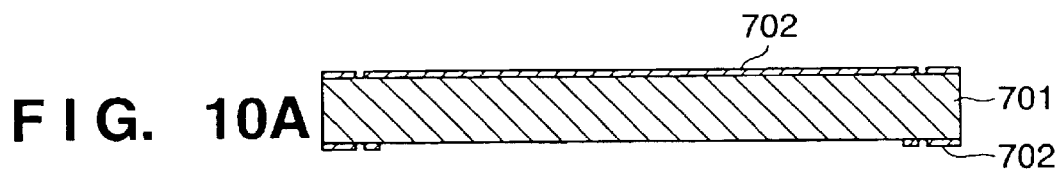
FIGS. 10A to 10E are views for explaining a method of forming a shield electrode in FIG. 8.

FIGS. 10A to 10E are views for explaining a method of forming the shield electrode 25. A silicon wafer 701 of the <100> direction which is made conductive by doping an impurity is prepared, and 300-nm thick SiO$_2$ layers are formed as mask layers 702 on the two surfaces of the substrate 701 by thermal oxidation. Portions of one mask layer 702 that serve as a prospective hollow portion and alignment grooves are removed by patterning the mask layer 702 by photolithography and etching processes (FIG. 10A).

Figure 10B:
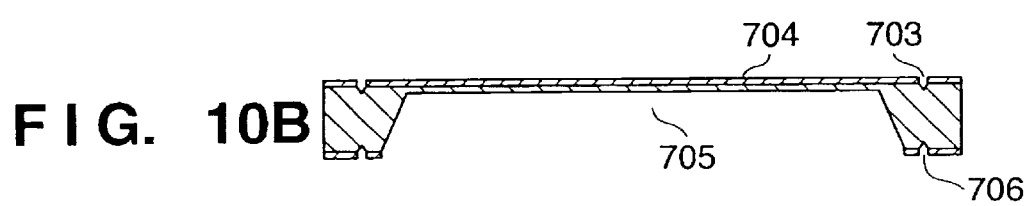

The silicon wafer is etched from the lower surface at 90° C. by using a 22% aqueous tetramethylammonium hydroxide solution, thus forming a 20-μm thick membrane portion 704, a hollow portion 705, and alignment grooves 703 and 706 (FIG. 10B).

Figure 10C:
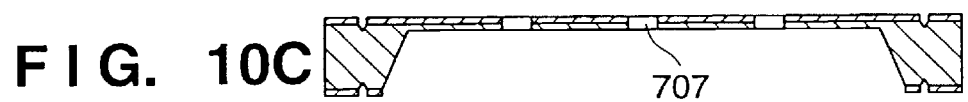

The mask layer 702 on the upper surface and the silicon substrate are etched by photolithography and dry etching processes to form a plurality of apertures 707 (FIG. 10C).

Figure 10D:
Figure 10E:
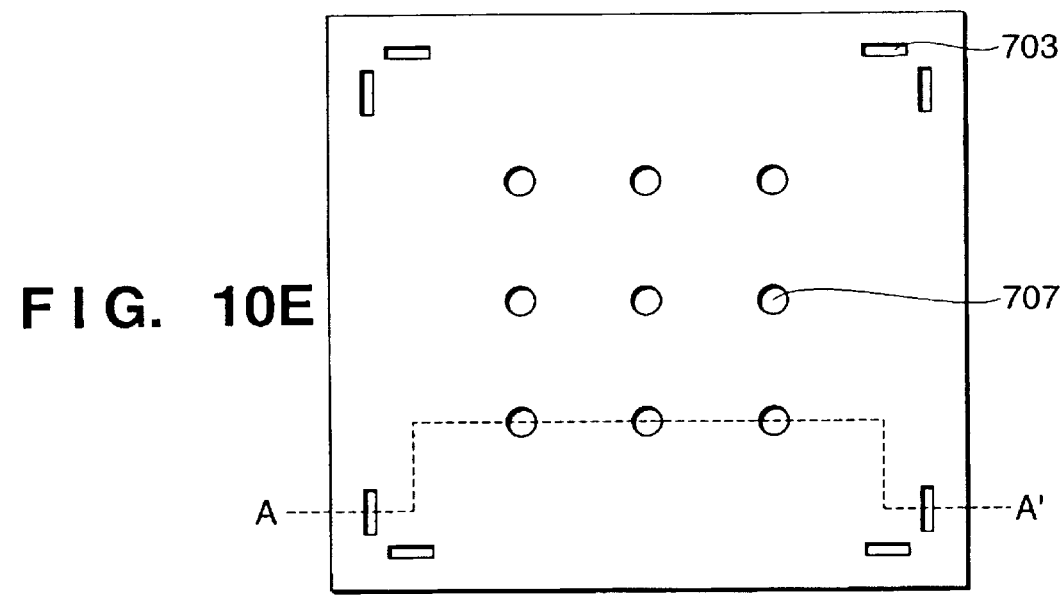

The mask layer 702 on the upper surface is removed by reactive ion etching using CF$_4$ gas (FIG. 10D). FIG. 10E is a plan view of the shield electrode shown in FIG. 10D.

The upper and lower electrodes 21 and 23 can be formed following the same procedures as in the second embodiment.

The electrodes 21, 22, 23 and shield electrode 25 formed in this fashion are aligned and joined to the base substrates 20 and 24 in the following procedures. The lower electrode 23 is first joined and fixed to the upper surface of the base substrate 24. Then, the middle electrode 22 is joined and fixed to the upper surface of the base substrate 24. In joining each electrode, an aqueous hydrofluoric acid solution is applied to a joining portion, and the electrode is aligned and joined while observed with an infrared camera. Thereafter, the upper electrode 21 is joined and fixed to the base substrate 20, and the shield electrode 25 is joined and fixed to the same surface of the base substrate 20. The two units are aligned via the spacers 26 and fixed with the adhesive 27.

Fourth Embodiment

Figure 11:
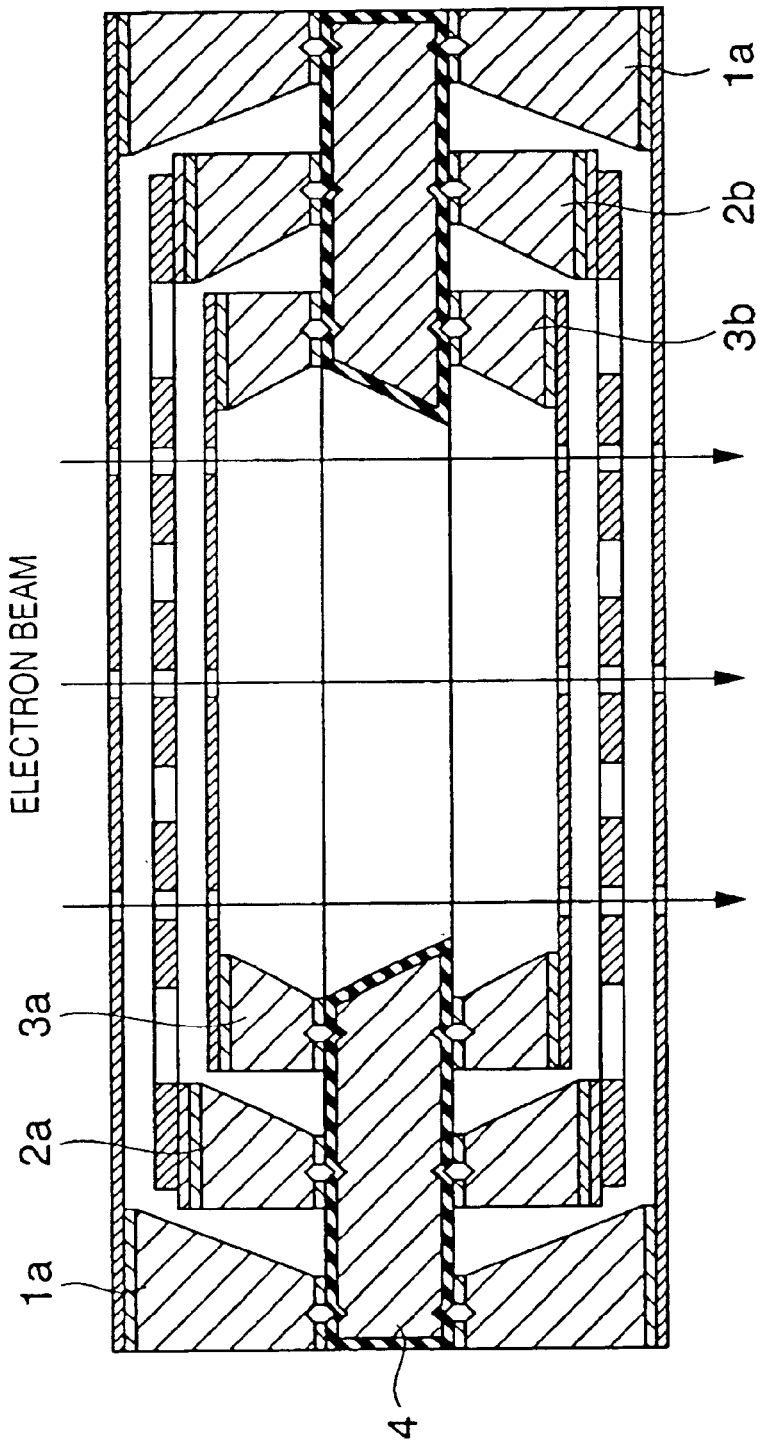
FIG. 11 is a sectional view showing the structure of an electron optical system array according to still another embodiment.

FIG. 11 is a sectional view showing an electron optical system array according to the fourth embodiment of the present invention. The fourth embodiment adopts two sets of the electrodes 1, 2, and 3 in the first embodiment. More specifically, in this electron optical system array, first, second, and third electrodes 1a, 2a, and 3a corresponding to the electrodes 1, 2, and 3 of the first embodiment are supported by one surface of a base substrate 4, whereas fourth, fifth, and sixth electrodes 3b, 2b, and 1b corresponding to the electrodes 3, 2, and 1 of the first embodiment are supported by the other surface of the base substrate 4. This arrangement uses one base substrate as a position reference, so that an electron optical system array having a high alignment accuracy between electrodes can be attained. This multi-stage electron optical system array is suitable when only a one-stage electron lens cannot provide a sufficient lens power.

In the fourth embodiment, one electron optical system array is comprised of two sets of the electrodes 1, 2, and 3 of the first embodiment. Alternatively, one electron optical system array may be constituted by three or more sets of electrodes.

Fifth Embodiment

Figure 12:
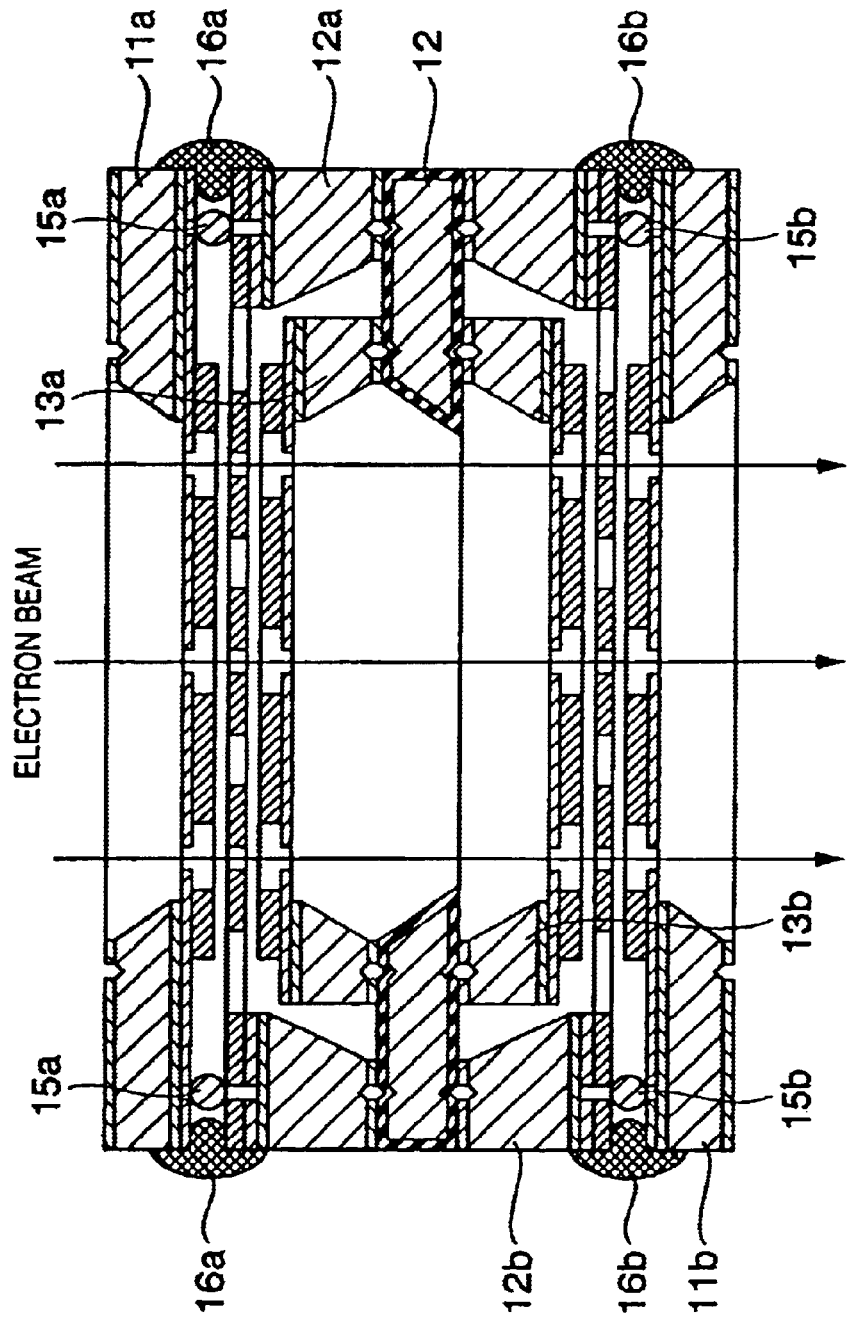
FIG. 12 is a sectional view showing the structure of an electron optical system array according to still another embodiment.

FIG. 12 is a sectional view showing an electron optical system array according to the fifth embodiment of the present invention. The fifth embodiment adopts two sets of the electrodes 11, 12, and 13 in the second embodiment. More specifically, in this electron optical system array, first, second, and third electrodes 11a, 12a, and 13a corresponding to the electrodes 11, 12, and 13 of the second embodiment are supported by one surface of a base substrate 12, whereas fourth, fifth, and sixth electrodes 13b, 12b, and 11b corresponding to the electrodes 13, 12, and 11 of the second embodiment are supported by the other surface of the base substrate 12. Since this arrangement uses one base substrate as a position reference, an electron optical system array having a high alignment accuracy between two electron optical system arrays can be obtained. This multi-stage electron optical system array is suitable when only a one-stage electron lens cannot provide a sufficient lens power.

In the fifth embodiment, one electron optical system array is comprised of two sets of the electrodes 11, 12, and 13 of the second embodiment. Alternatively, one electron optical system array may be constituted by three or more sets of electrodes.

Sixth Embodiment

Figure 13:
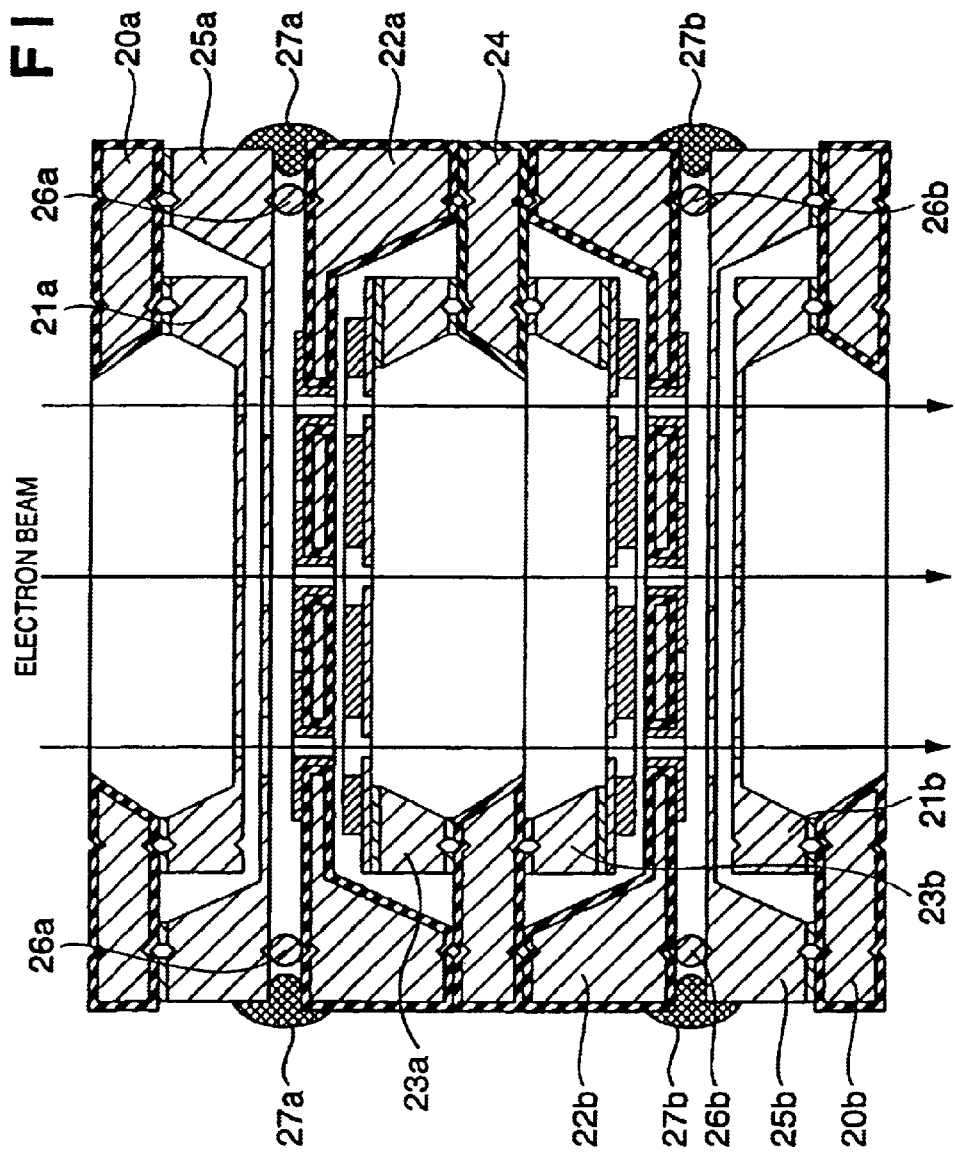
FIG. 13 is a sectional view showing the structure of an electron optical system array according to still another embodiment.

FIG. 13 is a sectional view showing an electron optical system array according to the sixth embodiment of the present invention. The sixth embodiment employs two sets of the electrodes 21, 22, and 23 in the third embodiment. More specifically, this electron optical system array comprises a set of first, second, and third electrodes 21a, 22a, and 23a corresponding to the electrodes 21, 22, and 23 of the third embodiment, and a set of fourth, fifth, and sixth electrodes 23b, 22b, and 21b corresponding to the electrodes 23, 22, and 21 of the third embodiment. This arrangement uses one base substrate as a position reference, and thus an electron optical system array having a high alignment accuracy between two electron optical system arrays can be obtained. This multi-stage electron optical system array is suitable when only a one-stage electron lens cannot provide a sufficient lens power.

In the sixth embodiment, one electron optical system array is comprised of two sets of the electrodes 21, 22, and 23 of the third embodiment. Alternatively, one electron optical system array may be constituted by three or more sets of electrodes.

Wiring Example

Figure 14A:
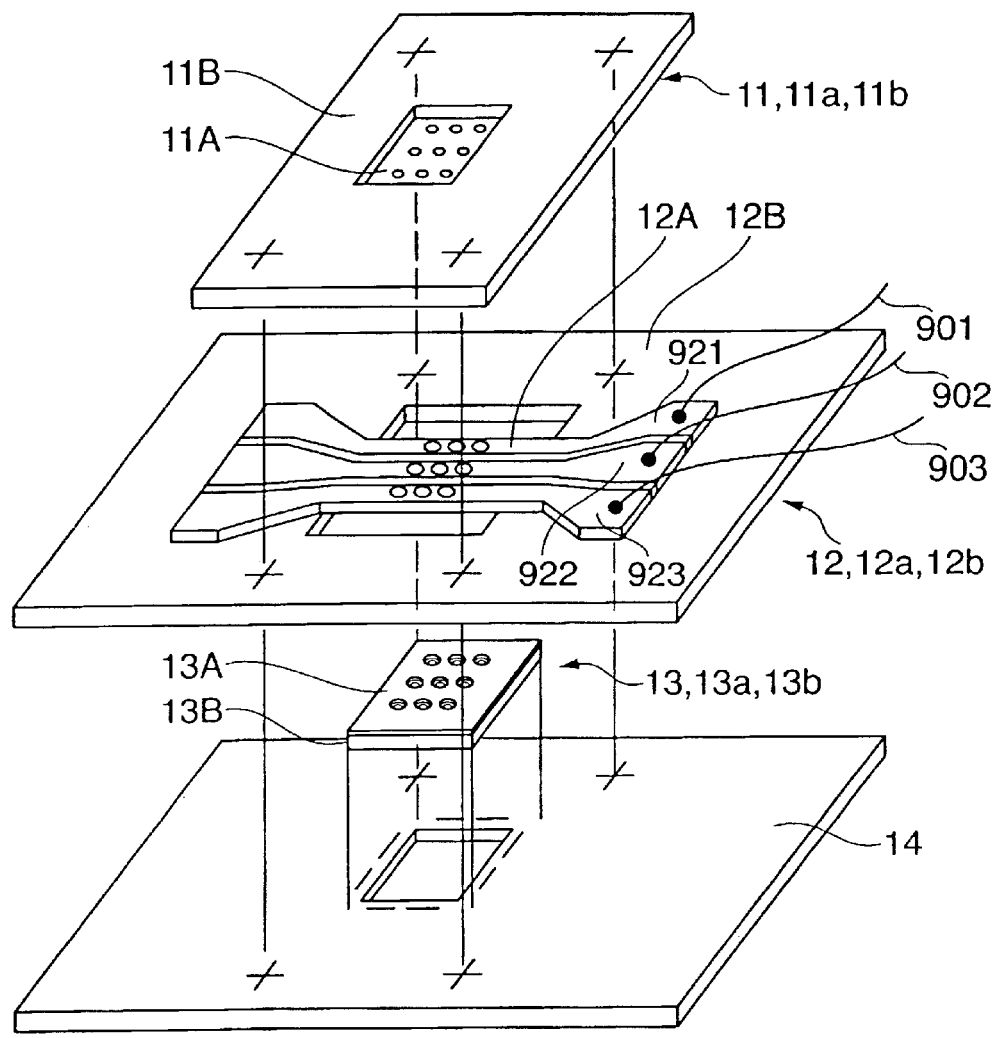
FIGS. 14A and 14B are a perspective view and plane view, respectively, for explaining a wiring example according to a preferred embodiment of the present invention.
Figure 14B:
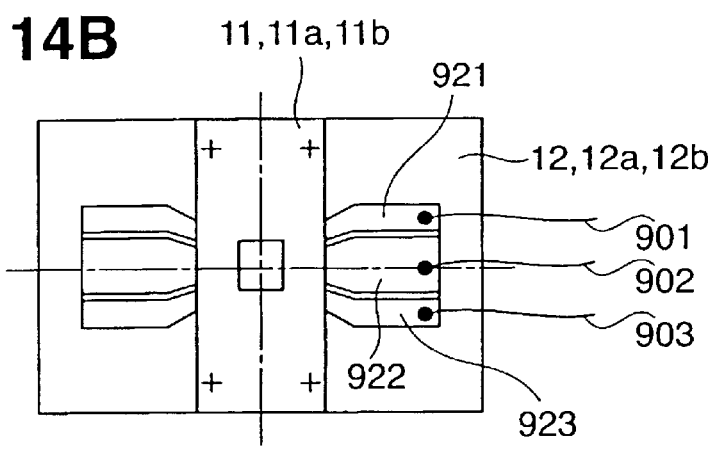

A wiring example suitable for the second or fifth embodiment will be described with reference to FIGS. 14A and 14B. FIG. 14A is a perspective view of an assembly, and FIG. 14B is a plan view. In this example, the support substrate 11B of the upper electrode 11 (11a, 11b) is smaller in size than the support substrate 12B of the middle electrode 12 (12a, 12b). As shown in FIG. 14A, the middle electrode 12 (12a, 12b) and lower electrode 13 (13a, 13b) are fixed to the base substrate 14 so as to form a nested structure, and the upper electrode 11 (11a, 11b) faces the middle electrode 12 (12a, 12b). In this arrangement, as shown in FIG. 14B, parts 921, 922 and 923 of the membrane 12A of the middle electrode 12 (12a, 12b) are exposed, which facilitates wiring to the middle electrode 12 (12a, 12b) by wire bonding or the like.

In the wiring example shown in FIGS. 14A and 14B, a plurality of arrayed apertures of the middle electrode (second electrode) are grouped in units of columns, and each of the grouped columns receives the same potential. In other words, the first column receives a potential via a wiring line 901, the second column receives a potential via a wiring line 902, and the third column receives a potential via a wiring line 903.

Electron Beam Exposure Apparatus

A multi-beam charged-particle exposure apparatus (electron beam exposure apparatus) will be exemplified as a system using an electron optical system array as described in each of the above-described embodiments. FIG. 15 is a schematic view showing the overall system. In FIG. 15, an electron gun 501 as a charged-particle source is constituted by a cathode 501a, grid 501b, and anode 501c. Electrons emitted by the cathode 501a form a crossover image (to be referred to as an electron source ES hereinafter) between the grid 501b and the anode 501c. An electron beam emitted by the electron source ES irradiates a correction electron optical system 503 via an irradiation electron optical system 502 serving as a condenser lens. The irradiation electron optical system 502 is comprised of electron lenses (Einzel lenses) 521 and 522 each having three aperture electrodes. The correction electron optical system 503 includes an electron optical system array to which the electron optical system array is applied, and forms a plurality of intermediate images of the electron source ES (details of the structure will be described later). The correction electron optical system 503 adjusts the formation positions of intermediate images so as to correct the influence of aberration of a projection electron optical system 504. Each intermediate image formed by the correction electron optical system 503 is reduced and projected by the projection electron optical system 504, and forms an image of the electron source ES on a wafer 505 as a surface to be exposed. The projection electron optical system 504 is constituted by a symmetrical magnetic doublet made up of a first projection lens 541 (543) and second projection lens 542 (544). Reference numeral 506 denotes a deflector for deflecting a plurality of electron beams from the correction electron optical system 503 and simultaneously displacing a plurality of electron source images on the wafer 505 in the X and Y directions; 507, a dynamic focus coil for correcting a shift in the focal position of an electron source image caused by deflection aberration generated when the deflector 506 operates; 508, a dynamic stigmatic coil for correcting astigmatism among deflection aberrations generated by deflection; 509, a θ-Z stage which supports the wafer 505, is movable in the optical axis AX (Z-axis) direction and the rotational direction around the Z-axis, and has a stage reference plate 510 fixed thereto; 511, an X-Y stage which supports the θ-Z stage and is movable in the X and Y directions perpendicular to the optical axis AX (Z-axis); and 512, a reflected-electron detector for detecting reflected electrons generated upon irradiating a mark on the stage reference plate 510 with an electron beam.

Figure 16A:
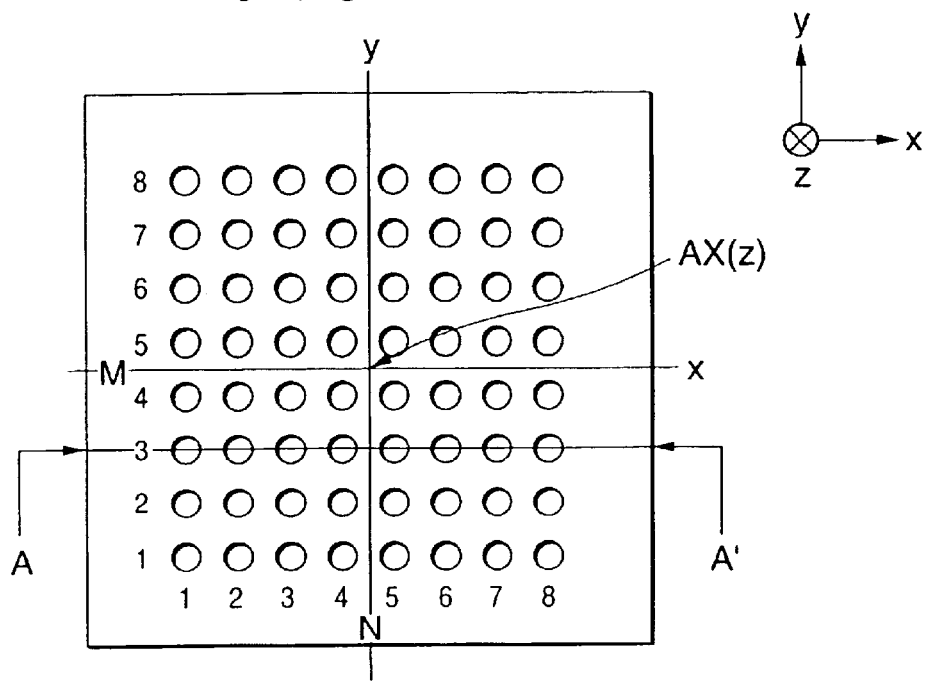
FIGS. 16A and 16B are a plan view and sectional view, respectively, for explaining details of a correction electron optical system.
Figure 16B:
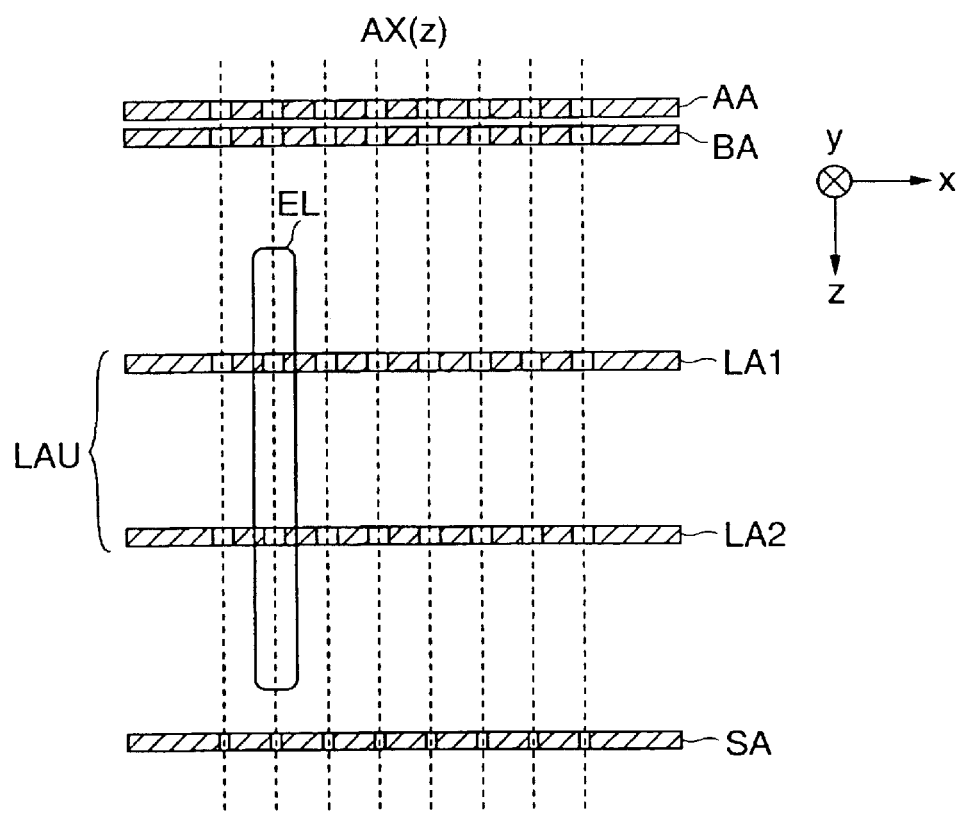

FIGS. 16A and 16B are views for explaining details of the correction electron optical system 503. The correction electron optical system 503 comprises an aperture array AA, blanker array BA, element electron optical system array unit LAU, and stopper array SA along the optical axis. FIG. 16A is a view of the correction electron optical system 503 when viewed from the electron gun 501, and FIG. 16B is a sectional view taken along the line A–A' in FIG. 16A. As shown in FIG. 16A, the aperture array AA has an array (8×8) of apertures regularly formed in a substrate, and splits an incident electron beam into a plurality of (64) electron beams. The blanker array BA is constituted by forming on one substrate a plurality of deflectors for individually deflecting a plurality of electron beams split by the aperture array AA. The element electron optical system array unit LAU is formed from first and second electron optical system arrays LA1 and LA2 as electron lens arrays each prepared by two-dimensionally arraying a plurality of electron lenses on the same surface. The electron optical system arrays LA1 and LA2 have a structure as an application of the electron optical system array described in the above embodiments to an 8×8 array. The first and second electron optical system arrays LA1 and LA2 are fabricated by the above-mentioned method. The element electron optical system array unit LAU constitutes one element electron optical system EL by the electron lenses of the first and second electron optical system arrays LA1 and LA2 that use the common X-Y coordinate system. The stopper array SA has a plurality of apertures formed in a substrate, similar to the aperture array AA. Only a beam deflected by the blanker array BA is shielded by the stopper array SA, and ON/OFF operation of an incident beam to the wafer 505 is switched for each beam under the control of the blanker array.

Since the charged-particle beam exposure apparatus of this embodiment adopts an excellent electron optical system array as described above for the correction electron optical system, an apparatus having a very high exposure precision can be provided and can increase the integration degree of a device to be manufactured in comparison with the prior art.

Example of Semiconductor Production System

A production system for a semiconductor device (semiconductor chip such as an IC or LSI, liquid crystal panel, CCD, thin-film magnetic head, micromachine, or the like) using the exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 17:
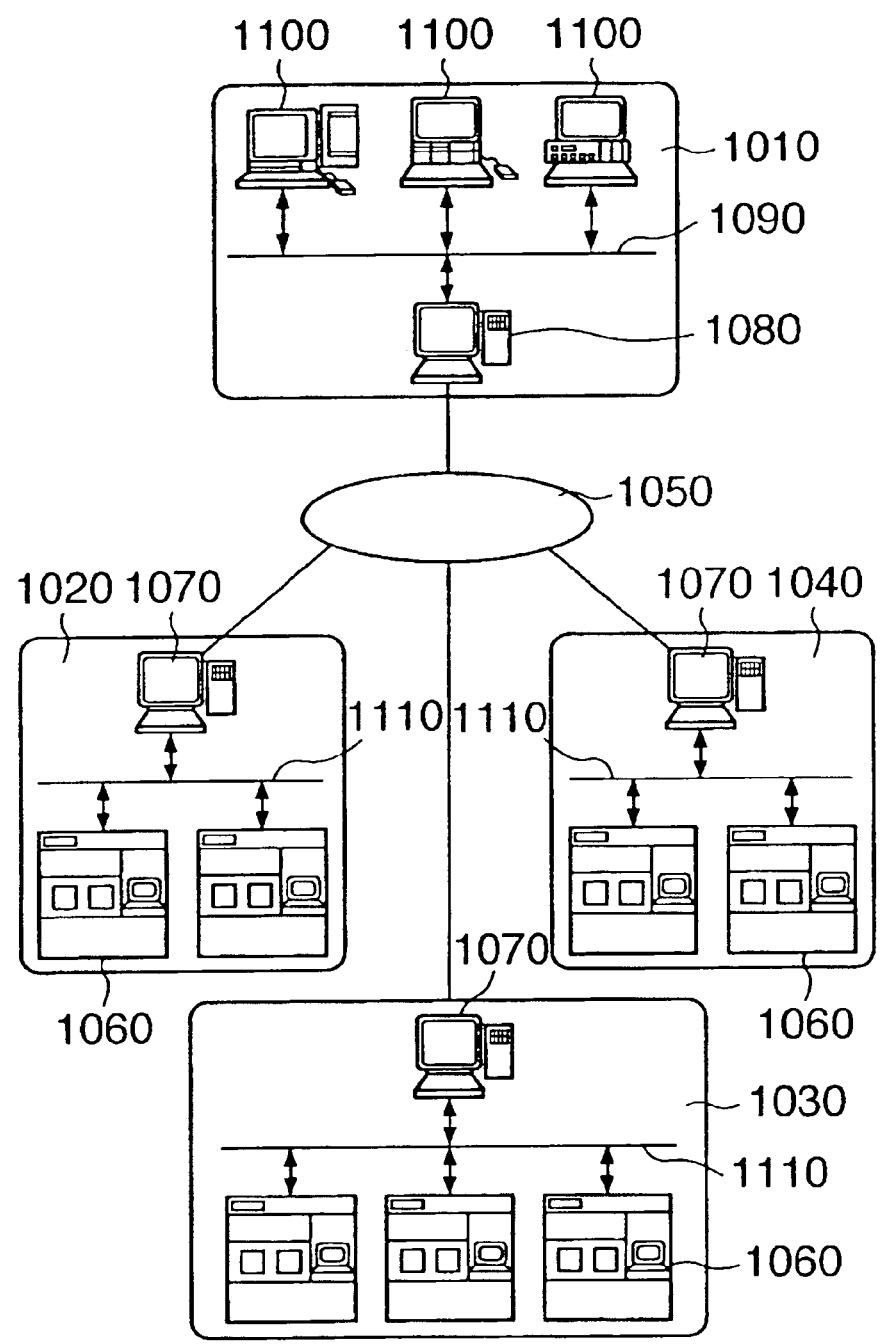
FIG. 17 is a view showing the concept of a semiconductor device production system when viewed from a given angle.

FIG. 17 shows the overall system cut out at a given angle. In FIG. 17, reference numeral 1010 denotes a business office of a vendor (apparatus supply manufacturer) which provides a semiconductor device manufacturing apparatus. Assumed examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 1010 comprises a host management system 1080 for providing a maintenance database for the manufacturing apparatus, a plurality of operation terminal computers 1100, and a LAN (Local Area Network) 1090 which connects the host management system 1080 and computers 1100 to construct an intranet. The host management system 1080 has a gateway for connecting the LAN 1090 to Internet 1050 as an external network of the business office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus for monitoring the operation status of each manufacturing apparatus 1060. The host management system 1070 in each of the factories 1020 to 1040 has a gateway for connecting the LAN 1110 in the factory to the Internet 1050 as an external network of the factory. Each factory can access the host management system 1080 of the vendor 1010 from the LAN 1110 via the Internet 1050. Typically, the security function of the host management system 1080 authorizes access of only a limited user to the host management system 1080.

In this system, the factory notifies the vender via the Internet 1050 of status information (e.g., the symptom of a manufacturing apparatus in trouble) representing the operation status of each manufacturing apparatus 1060. The vender transmits, to the factory, response information (e.g., information designating a remedy against the trouble, or remedy software or data) corresponding to the notification, or maintenance information such as the latest software or help information. Data communication between the factories 1020 to 1040 and the vender 1010 and data communication via the LAN 1110 in each factory typically adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

Figure 18:
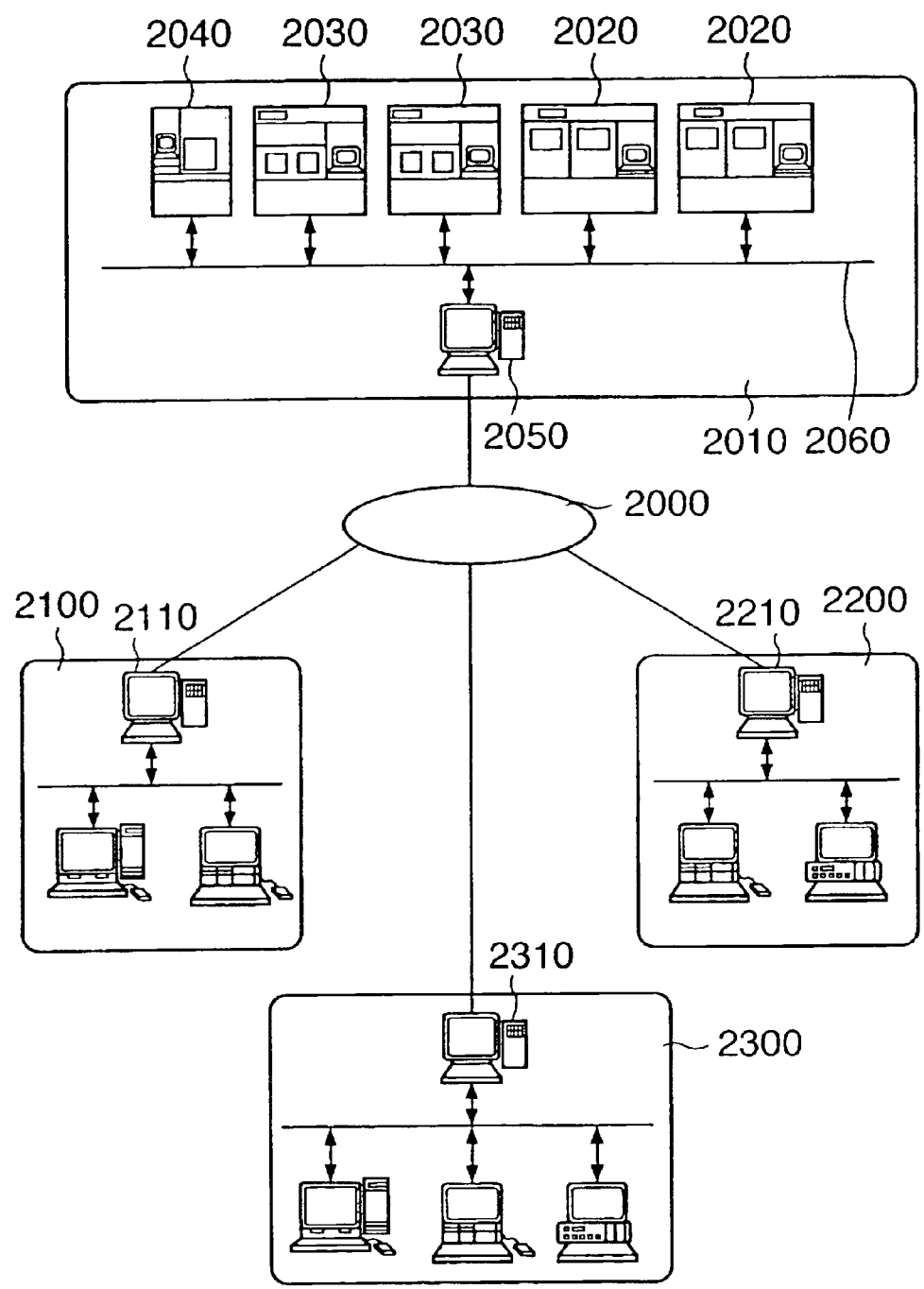
FIG. 18 is a view showing the concept of the semiconductor device production system when viewed from another angle.

FIG. 18 is a view showing the concept of the overall system of this embodiment that is cut out at a different angle from FIG. 17. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 18, a factory having a plurality of manufacturing apparatuses of a plurality of vendors, and the management systems of the vendors for these manufacturing apparatuses are connected via the external network of the factory, and maintenance information of each manufacturing apparatus is communicated. In FIG. 18, reference numeral 2010 denotes a manufacturing factory of a manufacturing apparatus user (semiconductor device manufacturer) where manufacturing apparatuses for various processes, e.g., an exposure apparatus 2020, resist processing apparatus 2030, and film formation apparatus 2040 are installed in the manufacturing line of the factory. FIG. 18 shows only one manufacturing factory 2010, but a plurality of factories are networked in practice. The respective apparatuses in the factory are connected to a LAN 2060 to construct an intranet, and a host management system 2050 manages the operation of the manufacturing line. The business offices of vendors (apparatus supply manufacturers) such as an exposure apparatus manufacturer 2100, resist processing apparatus manufacturer 2200, and film formation apparatus manufacturer 2300 comprise host management systems 2110, 2210, and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors for the respective apparatuses are connected via the Internet or dedicated-line network serving as an external network 2000. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 2000. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 19 on the display. While referring to this window, the operator who manages manufacturing apparatuses in each factory inputs, in input items on the windows, pieces of information such as the type of manufacturing apparatus (4010), serial number (4020), subject of trouble (4030), occurrence date (4040), degree of urgency (4050), symptom (4060), remedy (4070), and progress (4080). The pieces of input information are transmitted to the maintenance database via the Internet, and appropriate maintenance information is sent back from the maintenance database and displayed on the display. The user interface provided by the web browser realizes hyperlink functions (4100 to 4120), as shown in FIG. 19. This allows the operator to access detailed information of each item, receive the latest-version software to be used for a manufacturing apparatus from a software library provided by a vendor, and receive an operation guide (help information) as a reference for the operator in the factory.

Figure 20:
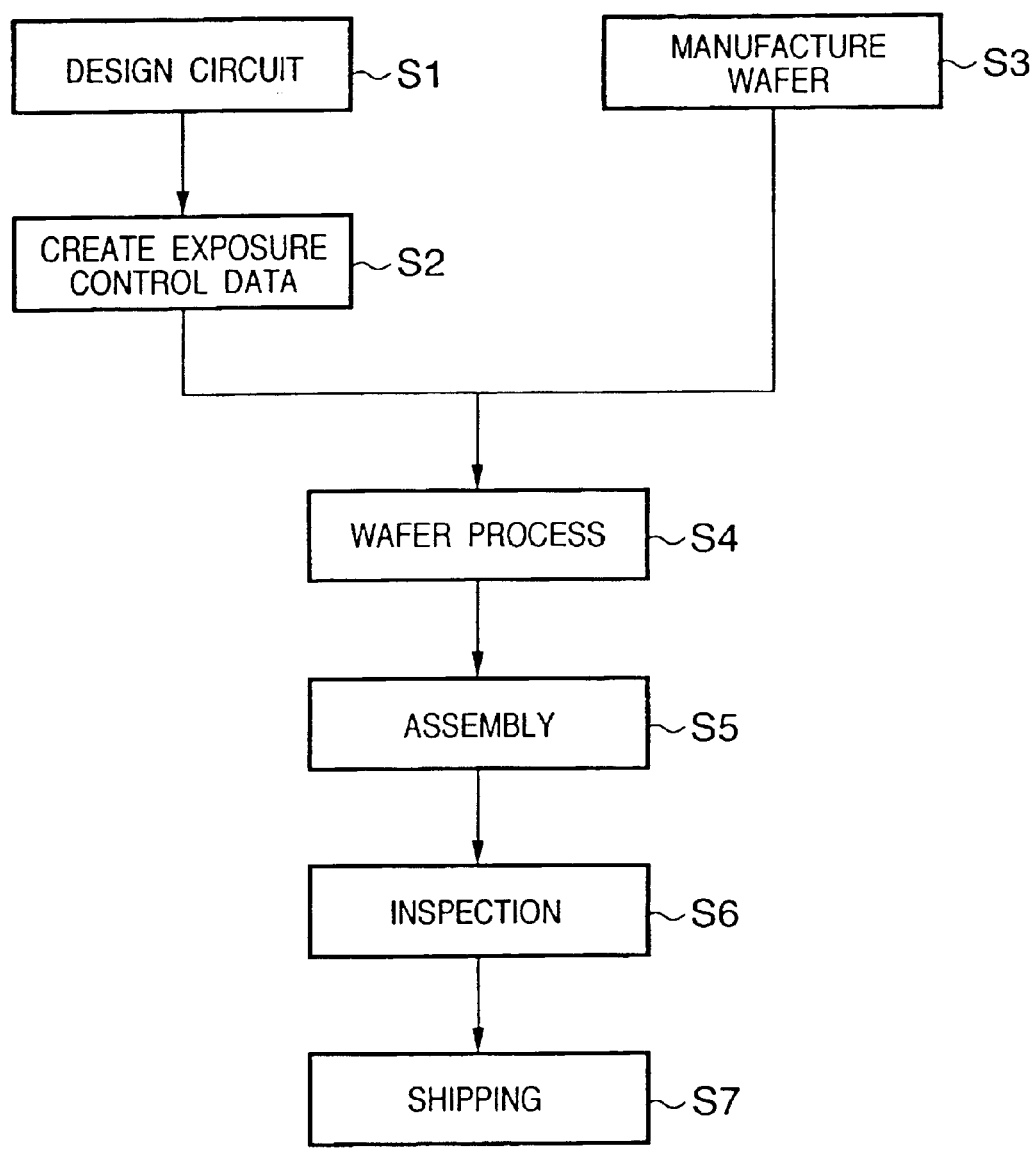
FIG. 20 is a flow chart for explaining the flow of a semiconductor device manufacturing process.

A semiconductor device manufacturing process using the above-described production system will be explained. FIG. 20 shows the flow of the whole manufacturing process of the semiconductor device. In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process may be performed in separate dedicated factories. In this case, maintenance is done for each of the factories by the above-described remote maintenance system. Information for production management and apparatus maintenance may be communicated between the pre-process factory and the post-process factory via the Internet or dedicated-line network.

Figure 21:
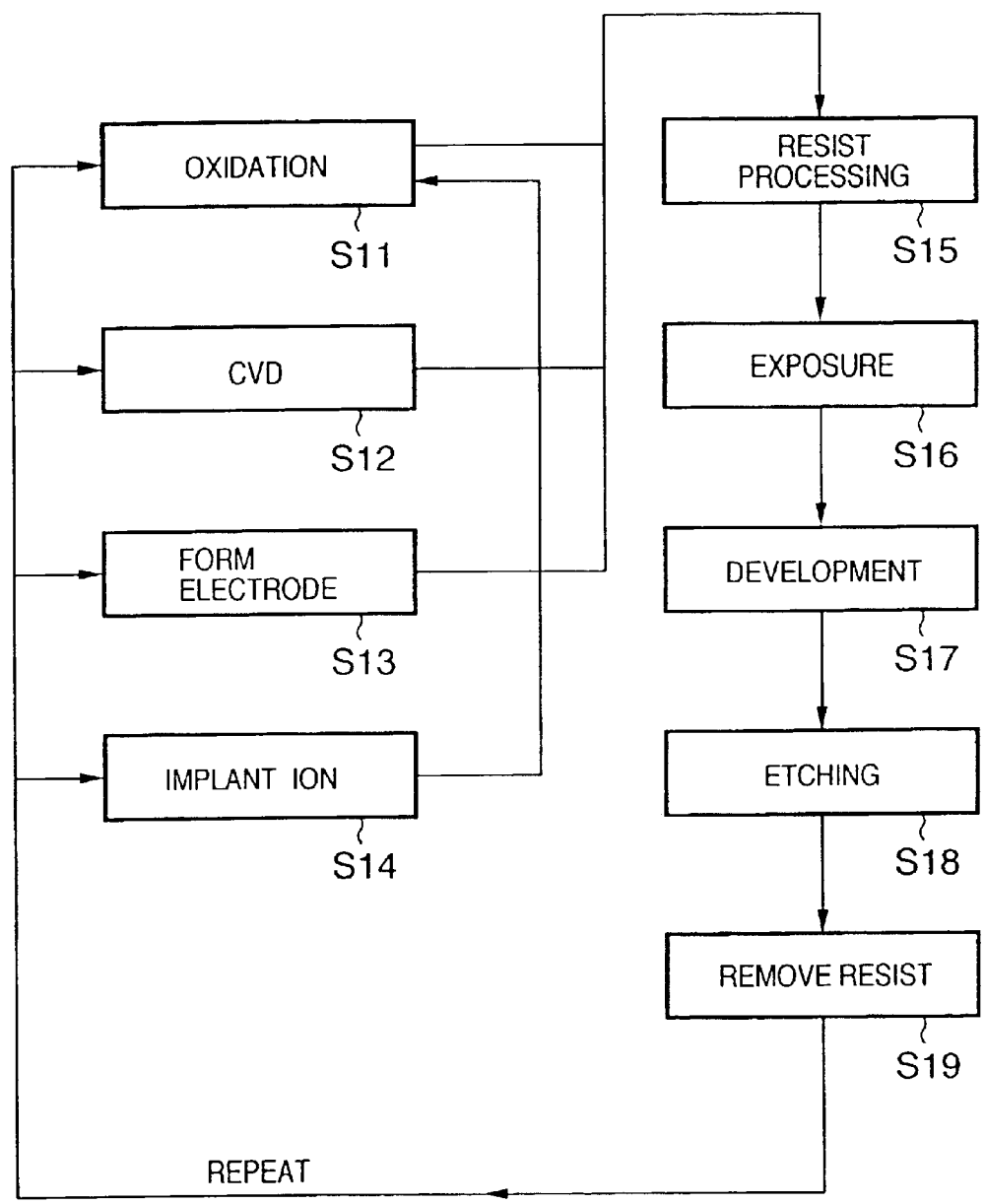
FIG. 21 is a flow chart for explaining details of a wafer process.

FIG. 21 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus draws (exposes) a circuit pattern on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if a trouble occurs, the manufacturing apparatus can be quickly recovered. The productivity of the semiconductor device can be increased in comparison with the prior art.

The present invention can provide an electron optical system array which realizes various conditions such as downsizing, high precision, and high reliability at high level. The present invention can also provide a high-precision exposure apparatus using the electron optical system array, a high-productivity device manufacturing method, a semiconductor device production factory, and the like.

As many apparently widely different embodiments of the present invention can be made without departing from the spirit and scope thereof, it is to be understood that the invention is not limited to the specific embodiments thereof except as defined in the appended claims.

What is claimed is:

1. An electron optical system array having a plurality of electron lenses, comprising:
   a plurality of electrodes arranged along paths of a plurality of charged-particle beams,
   wherein each of said plurality of electrodes has a membrane in which a plurality of apertures are formed on the paths of the plurality of charged-particle beams, and a support portion which supports the membrane at a periphery of the membrane, and said plurality of electrodes includes a first electrode and a second electrode, and the support portion of the second electrode is arranged outside the support portion of the first electrode.

2. The array according to claim 1, wherein the electron optical system array further comprises a base member which supports the first and second support portions.

3. The array according to claim 2, wherein the first and second support portions are supported by one surface of said base member.

4. The array according to claim 1, wherein said plurality of electrodes includes a third electrode and the support portion of the third electrode is arranged outside the support portion of the second support portion.

5. The array according to claim 4, wherein the electron optical system array further comprises a base member, and the support portions of all said plurality of electrodes are supported by said base member.

6. The array according to claim 5, wherein the support portions of all said plurality of electrodes are supported by one surface of said base member.

7. The array according to claim 1, wherein said plurality of electrodes includes a third electrode and a fourth electrode, and the support portion of the fourth electrode is arranged outside the support portion of the third electrode.

8. The array according to claim 7, wherein the electron optical system array further comprises a base member having first and second surfaces, said plurality of electrodes includes the third and fourth electrodes, and the support portions of the first and second electrodes are supported by the first surface and the support portions of the third and fourth electrodes are supported by the second surface.

9. The array according to claim 7, further comprising a first base member which supports the support portions of the first and second electrodes and a second base member which supports the support portions of the third and fourth electrodes.

10. The array according to claim 9, further comprising a coupling portion which couples said first base member with said second base member.

11. The array according to claim 1, wherein said plurality of electrodes includes a third electrode and is arranged such that the third electrode faces the second electrode.

12. The array according to claim 1, wherein said plurality of electrodes are arranged to prevent the membranes of said plurality of electrodes from contacting each other.

13. The array according to claim 1, wherein at least one of said plurality of electrodes is divided in units of columns each formed from a plurality of apertures.

14. The array according to claim 1, wherein at least one of said plurality of electrodes is an electrode for forming an electric field which acts on a charged-particle beam, and at least another one of said plurality of electrodes is a shield electrode.

15. An electron optical system array having a plurality of electron lenses comprising:

a plurality of electrodes arranged along paths of a plurality of charged-particle beams, wherein each of said plurality of electrodes has a membrane in which a plurality of apertures are formed on the paths of the plurality of charged-particle beams, and a support portion which supports the membrane, at least two of said plurality of electrodes are arranged to form a nested structure, the support portions of said at least two electrodes which form the nested structure have hollow portions, and one electrode is arranged inside the hollow portion of the other electrode.

16. An electron optical system array having a plurality of electron lenses, said array comprising:

a plurality of electrodes arranged along paths of a plurality of charged-particle beams, and a base member, wherein each of said plurality of electrodes has a membrane in which a plurality of apertures are formed on the paths of the plurality of charged-particle beams, and a support portion which supports the membrane, at least two of said plurality of electrodes are arranged to form a nested structure, the support portion of said at least two electrodes which form the nested structure are supported by said base member, one of said plurality of electrodes except for said at least two electrodes which form the nested structure faces an electrode located farthest from said base member out of said at least two electrodes which form the nested structure, and a thickness of the support portion of one of said plurality of electrodes except for said at least two electrodes which form the nested structure is smaller than a thickness of the support portion of said electrode located farthest from said base member out of said at least two electrodes which form the nested structure.

17. A method of manufacturing an electron optical system array having a plurality of electron lenses, the method comprising:

the preparation step of preparing a plurality of electrodes each having a membrane in which a plurality of apertures for passing charged-particle beams are formed, and a support portion which supports the membrane at a periphery of the membrane;

the step of preparing a base member; and the fixing step of fixing the support portions of the plurality of electrodes to the base member so that the support portion of one of the plurality of electrodes is arranged outside the support portion of the other one of the plurality of electrodes.

18. The method according to claim 17, wherein in the electrode preparation step, the plurality of electrodes are fabricated using plating.

19. A charged-particle beam exposure apparatus comprising:

a charged-particle beam source for emitting a charged-particle beam;

an electron optical system array which has a plurality of electron lenses and forms a plurality of intermediate images of said charged-particle beam source by the plurality of electron lenses; and a projection electron optical system for projecting on a substrate the plurality of intermediate images formed by said electron optical system array, wherein said electron optical system array includes a plurality of electrodes arranged along paths of a plurality of charged-particle beams concerning the plurality of intermediate images, each of said plurality of electrodes has a membrane in which a plurality of apertures are formed on the paths of the plurality of charged-particle beams, and a support portion which supports the membrane at a periphery of the membrane, and said plurality of electrodes includes a first electrode and a second electrode, and the support portion of the second electrode is arranged outside the sunport portion of the first electrode.

20. A device manufacturing method comprising the steps of:

installing a plurality of semiconductor manufacturing apparatuses including a charged-particle beam exposure apparatus in a factory; and manufacturing a semiconductor device by using the plurality of semiconductor manufacturing apparatuses, wherein the charged-particle beam exposure apparatus includes
a charged-particle beam source for emitting a charged-particle beam,
an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array, the electron optical system array includes a plurality of electrodes arranged along paths of a plurality of charged-particle beams concerning the plurality of intermediate images, each of the plurality of electrodes has a membrane in which a plurality of apertures are formed on the paths of the plurality of charged-particle beams, and a support portion which supports the membrane at a periphery of the membrane, and said plurality of electrodes includes a first electrode and a second electrode, and the support portion of the second electrode is arranged outside the support portion of the first electrode.

21. The method according to claim 20, further comprising the steps of:

connecting the plurality of semiconductor manufacturing apparatuses by a local area network;

connecting the local area network to an external network of the factory;

acquiring information about the charged-particle beam exposure apparatus from a database on the external network by using the local area network and the external network; and controlling the charged-particle beam exposure apparatus on the basis of the acquired information.

22. A semiconductor manufacturing factory comprising:

a plurality of semiconductor manufacturing apparatuses including a charged-particle beam exposure apparatus;

a local area network for connecting said plurality of semiconductor manufacturing apparatuses; and a gateway for connecting the local area network to an external network of said semiconductor manufacturing factory, wherein said charged-particle beam exposure apparatus includes
a charged-particle beam source for emitting a charged-particle beam,
an electron optical system array which has a plurality of electron lenses and forms a plurality of intermediate images of said charged-particle beam source by the plurality of electron lenses, and a projection electron optical system for projecting on a substrate the plurality of intermediate images formed by said electron optical system array, said electron optical system array includes a plurality of electrodes arranged along paths of a plurality of charged-particle beams concerning the plurality of intermediate images, each of said plurality of electrodes has a membrane in which a plurality of apertures are formed on the paths of the plurality of charged-particle beams, and a support portion which supports the membrane at a periphery of the membrane, and said plurality of electrodes includes a first electrode and a second electrode, and the support portion of the second electrode is arranged outside the support portion of the first electrode.

23. A maintenance method for a charged particle beam exposure apparatus, comprising the steps of:

preparing a database for storing information about maintenance of the charged particle beam exposure apparatus on an external network of a factory where the charged-particle beam exposure apparatus is installed;

connecting the charged-particle beam exposure apparatus to a local area network in the factory; and maintaining the charged-particle beam exposure apparatus on the basis of the information stored in the database by using the external network and the local area network, wherein the charged-particle beam exposure apparatus includes
a charged-particle beam source for emitting a charged-particle beam,
an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array, the electron optical system array includes a plurality of electrodes arranged along paths of a plurality of charged-particle beams concerning the plurality of intermediate images, each of the plurality of electrodes has a membrane in which a plurality of apertures are formed on the paths of the plurality of charged-particle beams, and a support portion which supports the membrane at a periphery of the membrane, and said plurality of electrodes includes a first electrode and a second electrode, and the support portion of the second electrode is arranged outside the support portion of the first electrode.

* * * * *

UNITED STATES PATENT AND TRADEMARK OFFICE
CERTIFICATE OF CORRECTION

PATENT NO. : 6,872,950 B2
DATED : March 29, 2005
INVENTOR(S) : Yasuhiro Shimada et al.

It is certified that error appears in the above-identified patent and that said Letters Patent is hereby corrected as shown below:

Title page,
Item [56], References Cited, U.S. PATENT DOCUMENTS,
"6,381,072 B1   4/2002   Burger……………….359/622" should be deleted.
OTHER PUBLICATIONS, third reference, "'Arrayed Miniature Electron Beam Columns for High Throughput Sub-100 nm Lithography,' T. H. P. CHang, et al., Journal of Vacuum Science and Technology B, vol. 10, No. 6, Nov./Dec. 1992, pp. 2743-2748." should read -- "Arrayed Miniature Electron Beam Columns for High Throughput Sub-100 nm Lithography, T. H. P. Chang, et al., Journal of Vacuum Science and Technology B, vol. 10, No. 6, Nov./Dec. 1992, pp 2743-2748. --.

Column 19,
Line 10, "sunport" should read -- support --.

Signed and Sealed this

Twentieth Day of September, 2005

JON W. DUDAS
*Director of the United States Patent and Trademark Office*